United States Patent
Lo et al.

(10) Patent No.: US 12,230,537 B2
(45) Date of Patent: Feb. 18, 2025

(54) SEMICONDUCTOR DEVICE STRUCTURE HAVING AIR GAP AND METHODS OF FORMING THE SAME

(71) Applicant: TAIWAN SEMICONDUCTOR MANUFACTURING COMPANY, LTD., Hsinchu (TW)

(72) Inventors: Ting-Ya Lo, Hsinchu (TW); Cheng-Chin Lee, Taipei (TW); Shao-Kuan Lee, Kaohsiung (TW); Chi-Lin Teng, Taichung (TW); Hsin-Yen Huang, New Taipei (TW); Hsiaokang Chang, Hsinchu (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 23 days.

(21) Appl. No.: 18/230,338

(22) Filed: Aug. 4, 2023

(65) Prior Publication Data

US 2023/0386901 A1 Nov. 30, 2023

Related U.S. Application Data

(62) Division of application No. 17/458,884, filed on Aug. 27, 2021.

(51) Int. Cl.
*H01L 21/768* (2006.01)
*H01L 23/522* (2006.01)

(52) U.S. Cl.
CPC .... *H01L 21/7682* (2013.01); *H01L 21/76829* (2013.01); *H01L 21/76831* (2013.01);
(Continued)

(58) Field of Classification Search
CPC .......... H01L 21/7682; H01L 21/76831; H01L 21/76837; H01L 21/76877
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |

(Continued)

*Primary Examiner* — Daniel Luke
(74) *Attorney, Agent, or Firm* — NZ CARR LAW OFFICE

(57) ABSTRACT

A method for forming an interconnect structure includes forming a first conductive layer over a dielectric layer, forming one or more openings in the first conductive layer to expose portions of dielectric surface of the dielectric layer and conductive surfaces of the first conductive layer, wherein the one or more openings separates the first conductive layer into one or more portions. The method includes forming a capping layer on exposed portions of the dielectric surface of the dielectric layer and conductive surface of the first conductive layer, forming a sacrificial layer in the one or more openings, recessing the sacrificial layer, forming a support layer on the recessed sacrificial layer in each of the one or more openings, removing the sacrificial layer to form an air gap in each of the one or more openings, forming a dielectric fill on the support layer, replacing the first conductive layer in the one or more openings with a second conductive layer, selectively forming a two-dimensional (2D) material layer on the second conductive layer, forming a first etch stop layer on the dielectric fill and the support layer, forming a second etch stop layer on the first etch stop layer and the 2D material layer, forming a dielectric material on the second etch stop layer, forming a contact opening through the dielectric material, the second etch stop layer, and the 2D material layer to expose a top surface of the second conductive layer, and forming a first conductive feature in the contact opening.

20 Claims, 13 Drawing Sheets

(52) U.S. Cl.
CPC .. *H01L 21/76832* (2013.01); *H01L 21/76837* (2013.01); *H01L 21/76846* (2013.01); *H01L 21/76877* (2013.01); *H01L 23/5226* (2013.01)

(56) References Cited

U.S. PATENT DOCUMENTS

| | | | |
|---|---|---|---|
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 11,201,085 | B2 * | 12/2021 | Chuang ............... H01L 21/7682 |
| 2014/0220754 | A1 * | 8/2014 | Min ...................... H10B 43/30 438/287 |
| 2021/0193566 | A1 * | 6/2021 | Lo ...................... H01L 21/7682 |
| 2022/0319990 | A1 * | 10/2022 | Huang ............... H01L 21/76831 |

\* cited by examiner

SEMICONDUCTOR DEVICE STRUCTURE HAVING AIR GAP AND METHODS OF FORMING THE SAME

CROSS-REFERENCE TO RELATED APPLICATIONS

This application is a divisional application of U.S. patent application Ser. No. 17/458,884 filed on Aug. 27, 2021, which is incorporated by reference in its entirety.

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, for any two adjacent conductive features, as the distance between the conductive features decreases, the resulting capacitance (a function of the dielectric constant (k value) of the insulating material divided by the distance between the conductive features) increases. This increased capacitance results in increased capacitive coupling between the conductive features, increased power consumption, and an increase in the resistive-capacitive (RC) time constant.

Therefore, there is a need in the art to provide an improved device that can address the issues mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
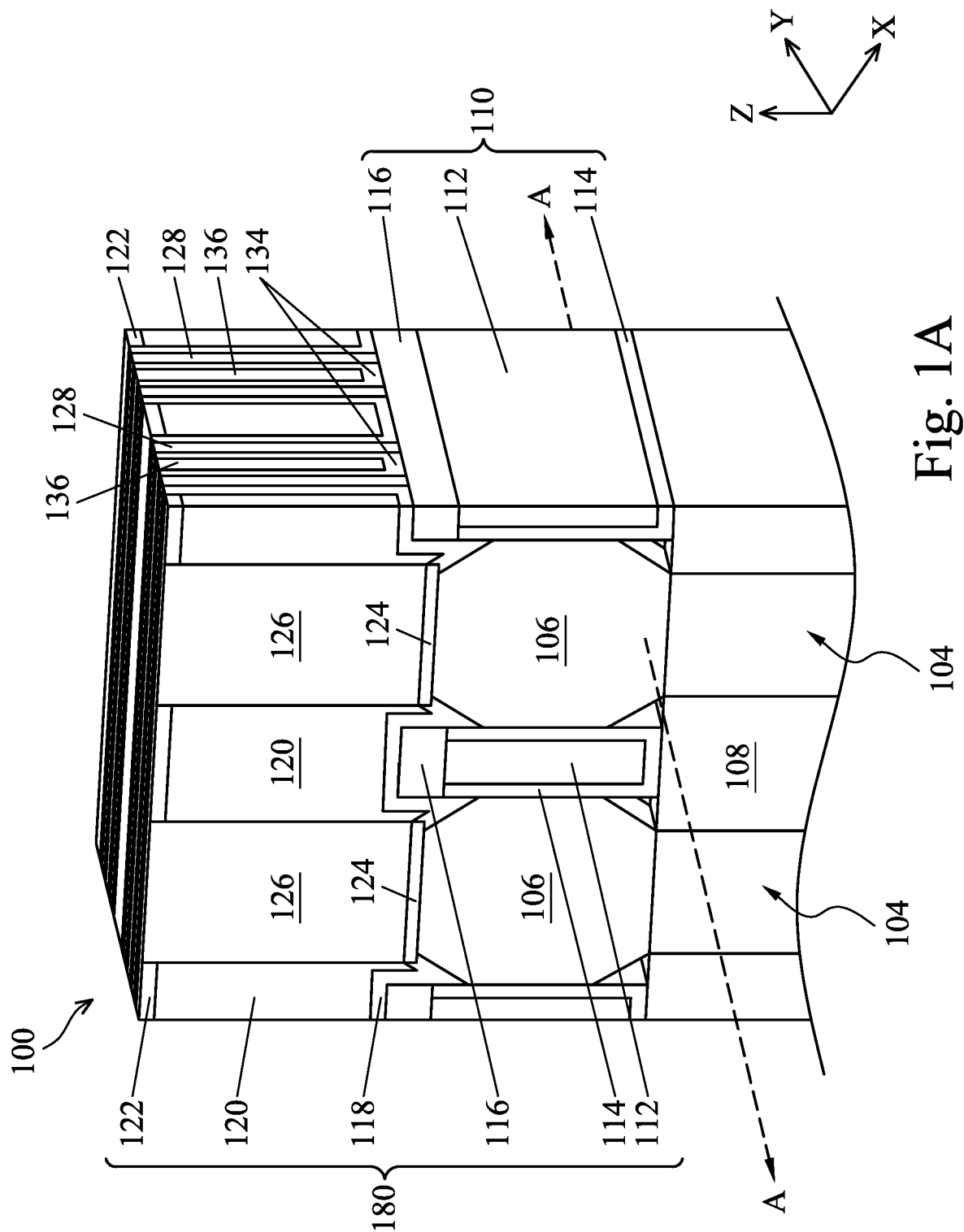
FIG. 1A is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
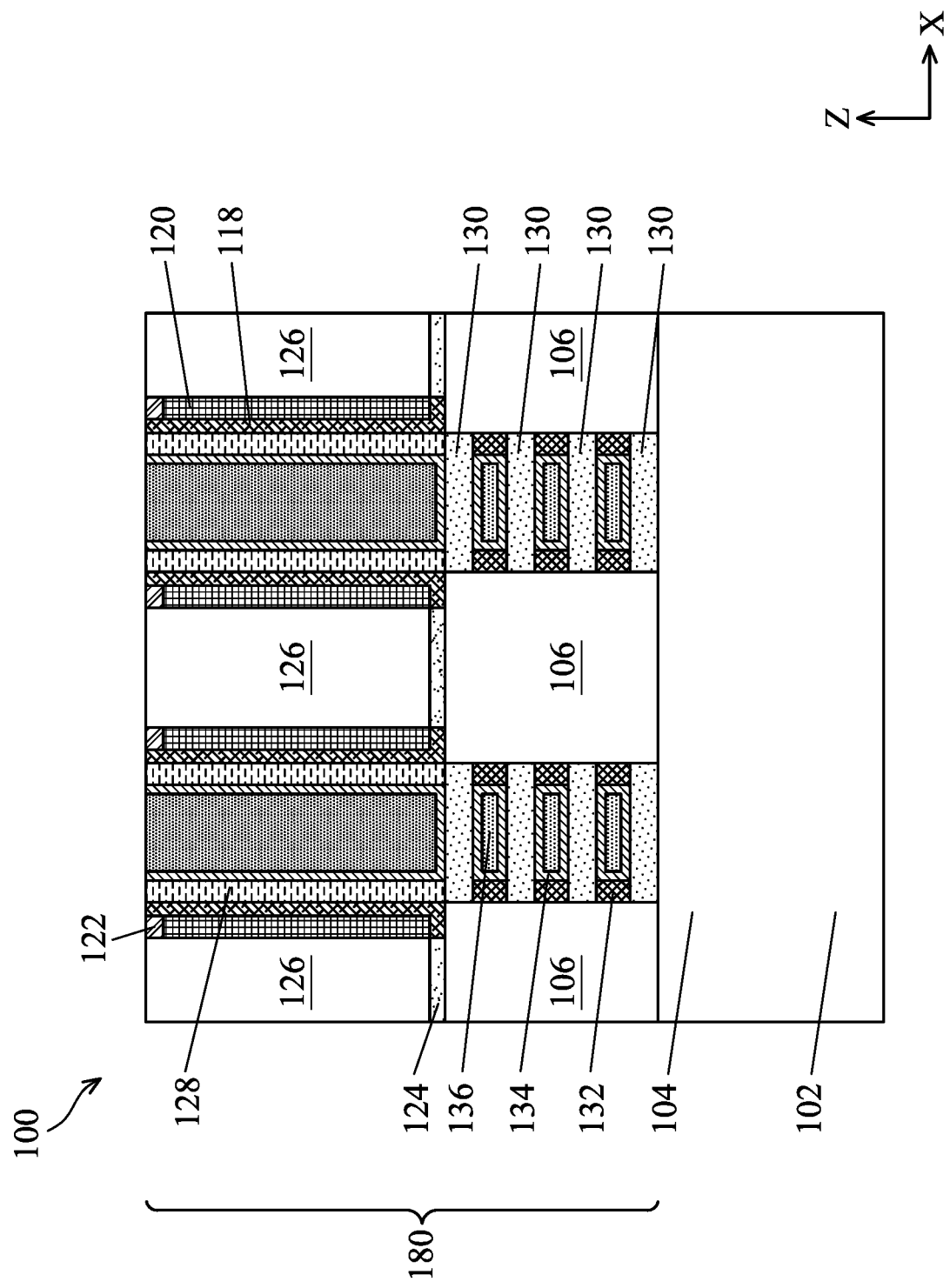
FIG. 1B is a cross-sectional side view of the stage of manufacturing the semiconductor device structure taken along line A-A of FIG. 1A, in accordance with some embodiments.

FIGS. 1A and 1B illustrate a stage of manufacturing a semiconductor device structure 100 that may benefit from embodiments of the present disclosure. As shown in FIGS. 1A and 1B, the semiconductor device structure 100 may include a substrate 102 (FIG. 1B) having substrate portions 104 extending therefrom. A device layer 180 is disposed over the substrate 102. The device layer 180 may include one or more devices, such as transistors, diodes, imaging sensors, resistors, capacitors, inductors, memory cells, combinations thereof, and/or other suitable devices. In some embodiments, the device layer 180 includes transistors, such as nanosheet FET having a plurality of channels wrapped around by a gate electrode layer. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanosheet channel(s) of the semiconductor device structure 100 may be surrounded by the gate electrode layer. The nanosheet transistors may be referred to as nanowire transistors, gate-all-around (GAA) transistors, multi-bridge channel (MBC) transistors, or any transistors having the gate electrode layer surrounding the channels. In some embodiments, the device layer 180 includes planar FET, FinFET, complementary FET (CFET), forksheet FET, or other suitable devices.

The substrate 102 may be a semiconductor substrate, such as a bulk silicon substrate. In some embodiments, the substrate 102 may be an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; other suitable materials; or combinations thereof. Possible substrates 102 also include a silicon-on-insulator (SOI) substrate. SOI substrates may be fabricated using separation by implantation of oxygen (SIMOX), wafer bonding, and/or other suitable methods.

The substrate portions 104 may be formed by recessing portions of the substrate 102. Thus, the substrate portions 104 may include the same material as the substrate 102. The substrate 102 and the substrate portions 104 may include various regions that have been suitably doped with impurities (e.g., p-type or n-type impurities). The dopants are, for example boron for a p-type field effect transistor (PFET) and phosphorus for an n-type field effect transistor (NFET).

The semiconductor device structure 100 includes source/drain (S/D) epitaxial features 106 disposed over the substrate portions 104. The S/D epitaxial features 106 may include a semiconductor material, such as Si or Ge, a III-V compound semiconductor, a II-VI compound semiconductor, or other suitable semiconductor material. Exemplary S/D epitaxial features 106 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D epitaxial features 106 may include p-type dopants, such as boron; n-type dopants, such as phosphorus or arsenic; and/or other suitable dopants including combinations thereof.

An insulating material 108 is disposed between adjacent substrate portions 104, as shown in FIG. 1A. The insulating material 108 may be made of an oxygen-containing material, such as silicon oxide or fluorine-doped silicate glass (FSG); a nitrogen-containing material, such as silicon nitride, silicon oxynitride (SiON), SiOCN, SiCN; a low-k dielectric material (e.g., a material having a k value lower than that of silicon oxide); or any suitable dielectric material. The insulating material 108 may be the shallow trench isolation (STI).

The semiconductor device structure 100 also includes dielectric structures 110 disposed over the insulating material 108 to separate adjacent S/D epitaxial features 106. The dielectric structure 110 may include a single dielectric material, such as the dielectric material of the insulating material 108, or different dielectric materials. In one embodiment shown in FIG. 1A, the dielectric structure 110 is a hybrid fin including a first dielectric material 112, a liner 114, and a second dielectric material 116. The liner 114 may include a low-k dielectric material. In some embodiments, the liner 114 includes $SiO_2$, SiN, SiCN, SiOC, or SiOCN. The first dielectric material 112 may include an oxygen-containing material, such as an oxide, and may be formed by FCVD. The oxygen-containing material may have a K value less than about 7, for example less than about 3. In some embodiments, the first dielectric material 112 includes the same material as the insulating material 108. The second dielectric material 116 may include SiO, SiN, SiC, SiCN, SiON, SiOCN, AlO, AlN, AlON, ZrO, ZrN, ZrAlO, HfO, or other suitable dielectric material. In some embodiments, the second dielectric material 116 includes a high-k dielectric material (e.g., a material having a k value greater than that of silicon oxide).

A contact etch stop layer (CESL) 118 and an interlayer dielectric (ILD) layer 120 are disposed over the dielectric features 110, as shown in FIG. 1A. The CESL 118 may include an oxygen-containing material or a nitrogen-containing material, such as silicon nitride, silicon carbon nitride, silicon oxynitride, carbon nitride, silicon oxide, silicon carbon oxide, the like, or a combination thereof. The materials for the ILD layer 120 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A cap layer 122 may be optionally disposed on the ILD layer 120, and the cap layer 122 may include a nitrogen-containing material, such as SiCN.

The semiconductor device structure 100 also includes conductive contacts 126 disposed in the ILD layer 120 and over the S/D epitaxial features 106, as shown in FIGS. 1A and 1B. The conductive contacts 126 may include one or more electrically conductive material, such as Ru, Mo, Co, Ni. W, Ti, Ta, Cu, Al, TiN and TaN. Silicide layers 124 may be disposed between the conductive contacts 126 and the S/D epitaxial features 106.

As shown in FIG. 1B, S/D epitaxial features 106 may be connected by one or more semiconductor layers 130, which may be channels of a FET. In some embodiments, the FET is a nanosheet FET including a plurality of semiconductor layers 130, and at least a portion of each semiconductor layer 130 is wrapped around by a gate electrode layer 136. The semiconductor layer 130 may be or include materials such as Si, Ge, SiC, GeAs, GaP, InP, InAs, InSb, GaAsP, AlInAs, AlGaAs, InGaAs, GaInP, GaInAsP, or other suitable material. In some embodiments, each semiconductor layer 130 is made of Si. The gate electrode layer 136 includes one or more layers of electrically conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof.

A gate dielectric layer 134 is disposed between the gate electrode layer 136 and the semiconductor layers 130. The gate dielectric layer 134 may include two or more layers, such as an interfacial layer and a high-k dielectric layer. In some embodiments, the interfacial layer is an oxide layer, and the high-k dielectric layer includes hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), hafnium dioxide-alumina ($HfO_2$—$Al_2O_3$) alloy, or other suitable high-k materials.

The gate dielectric layer 134 and the gate electrode layer 136 may be separated from the S/D epitaxial features 106 by inner spacers 132. The inner spacers 132 may include a dielectric material, such as SiON, SiCN, SiOC, SiOCN, or SiN. The gate dielectric layer 134 and the gate electrode layer 136 may be separated from the CESL 118 by spacers 128. The spacers 128 may include a dielectric material such as silicon oxide, silicon nitride, silicon carbide, silicon oxynitride, SiCN, silicon oxycarbide, SiOCN, and/or combinations thereof.

Figure 2B:
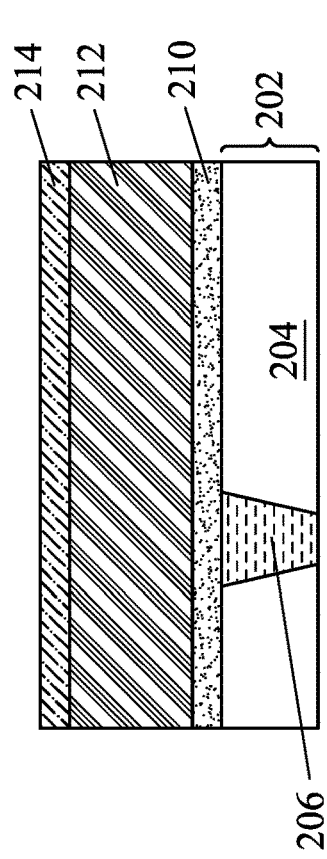
FIGS. 2A-2T are cross-sectional side views of various stages of manufacturing an interconnect structure, in accordance with some embodiments.
Figure 2A:
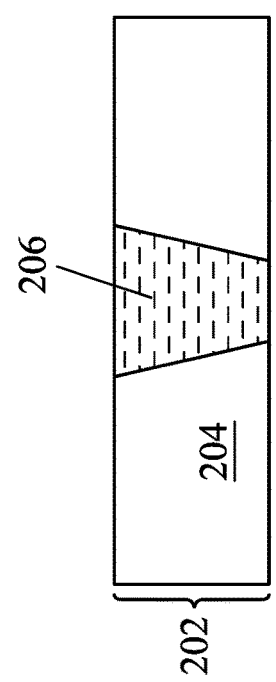
Figure 2C:
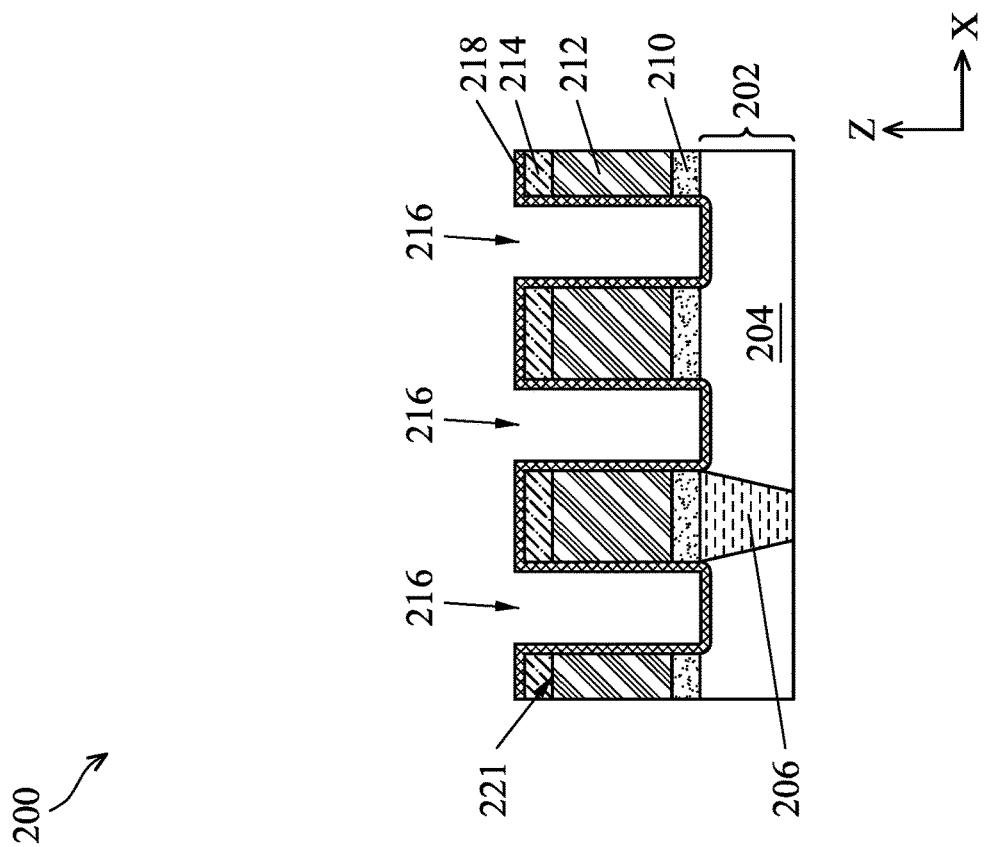
Figure 2D:
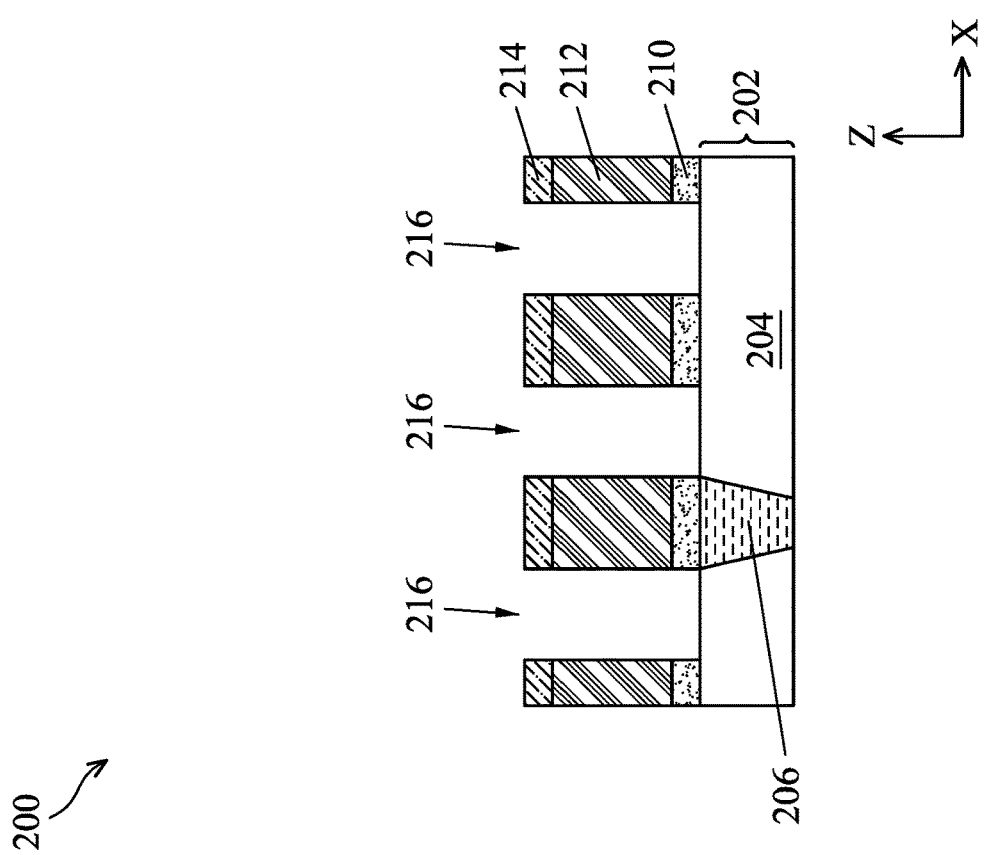
Figure 2F:
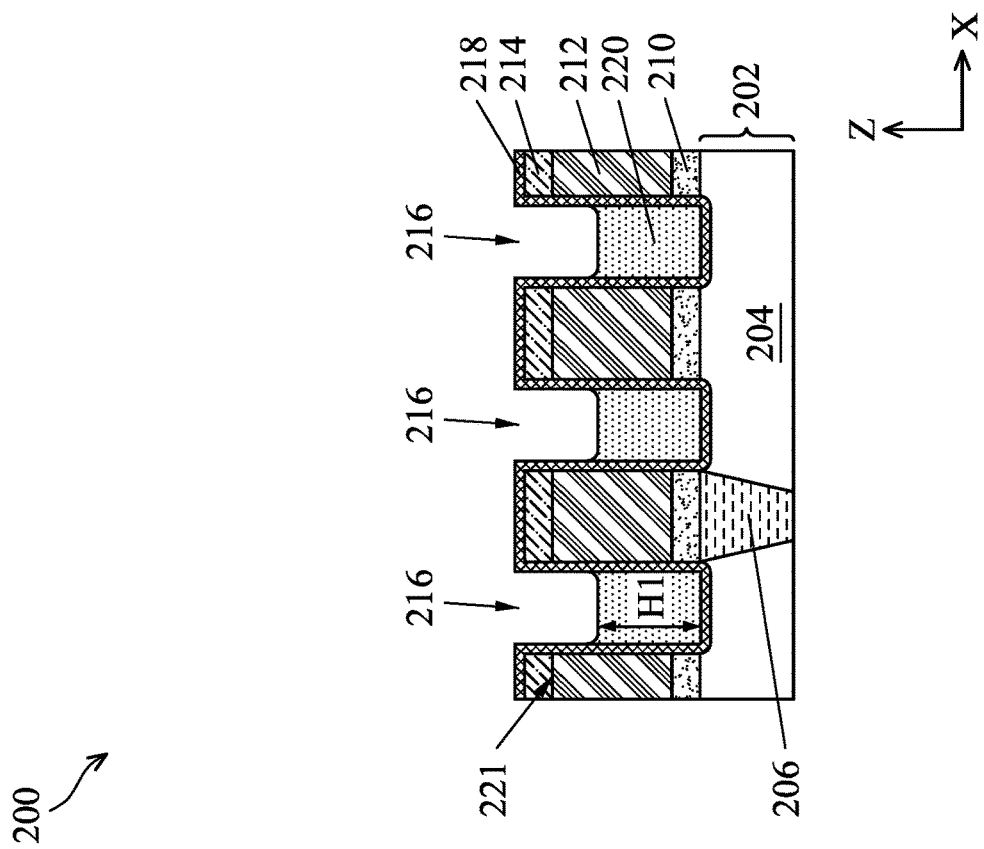
Figure 2E:
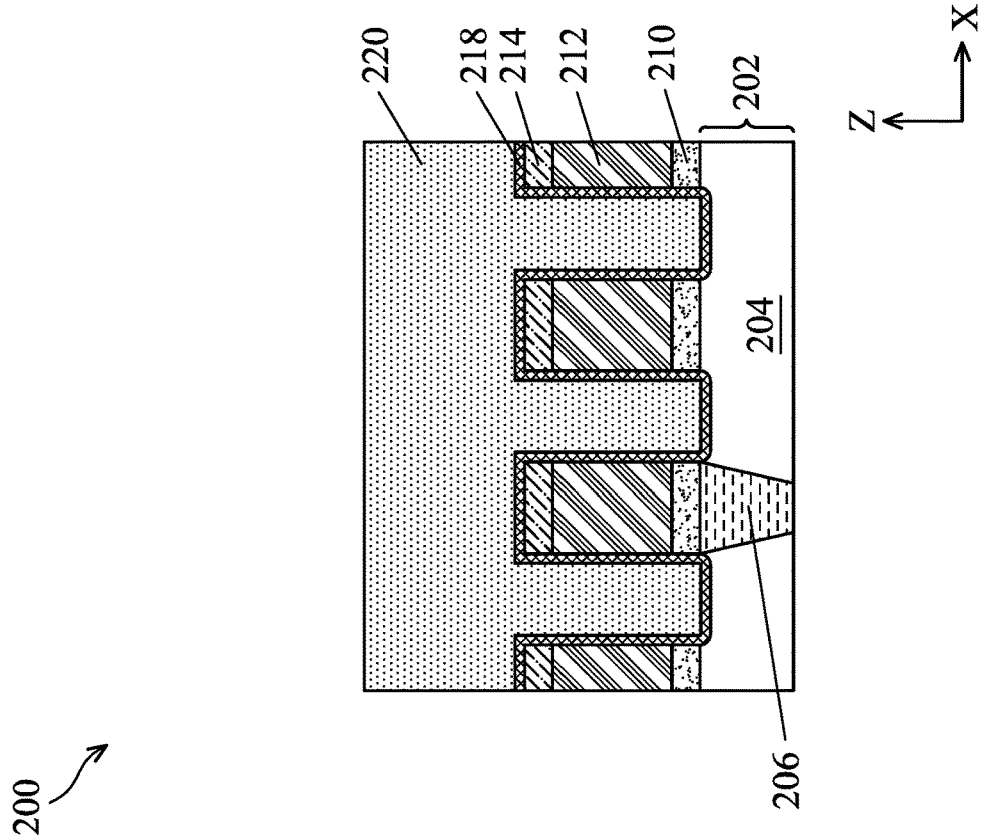
Figure 2G:
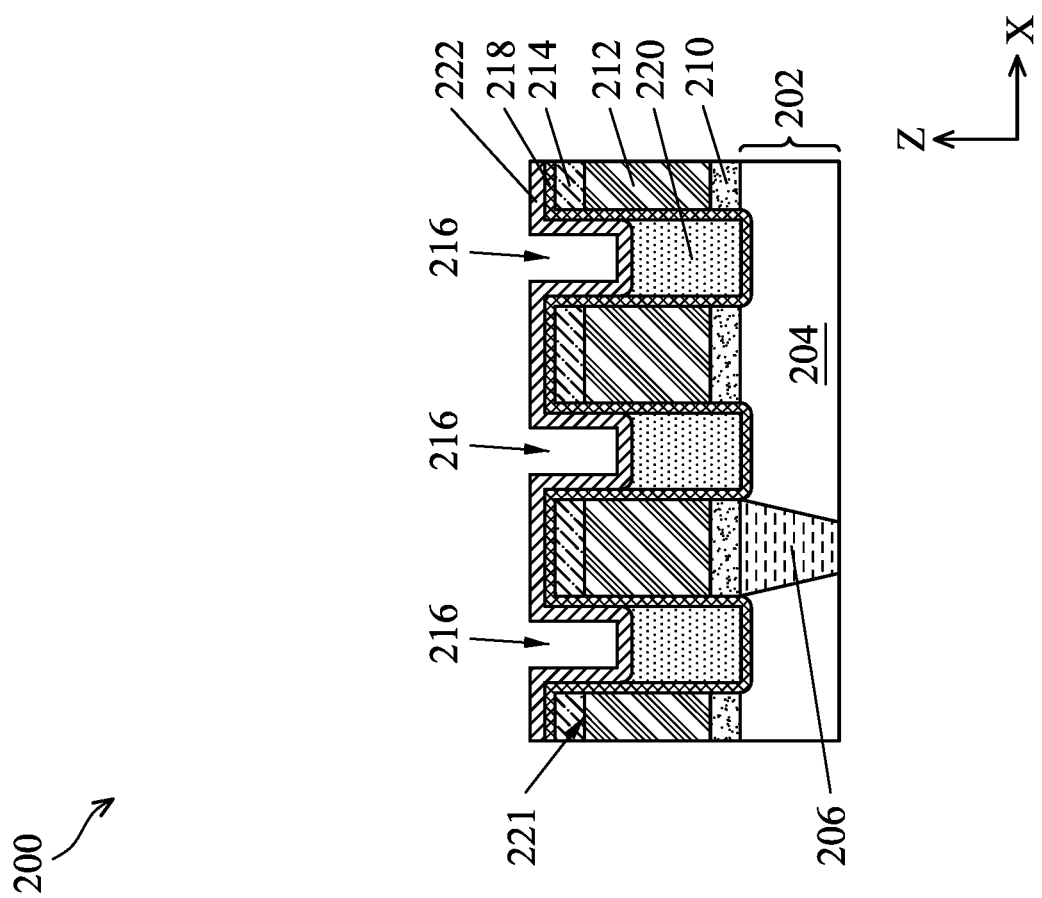
Figure 2H:
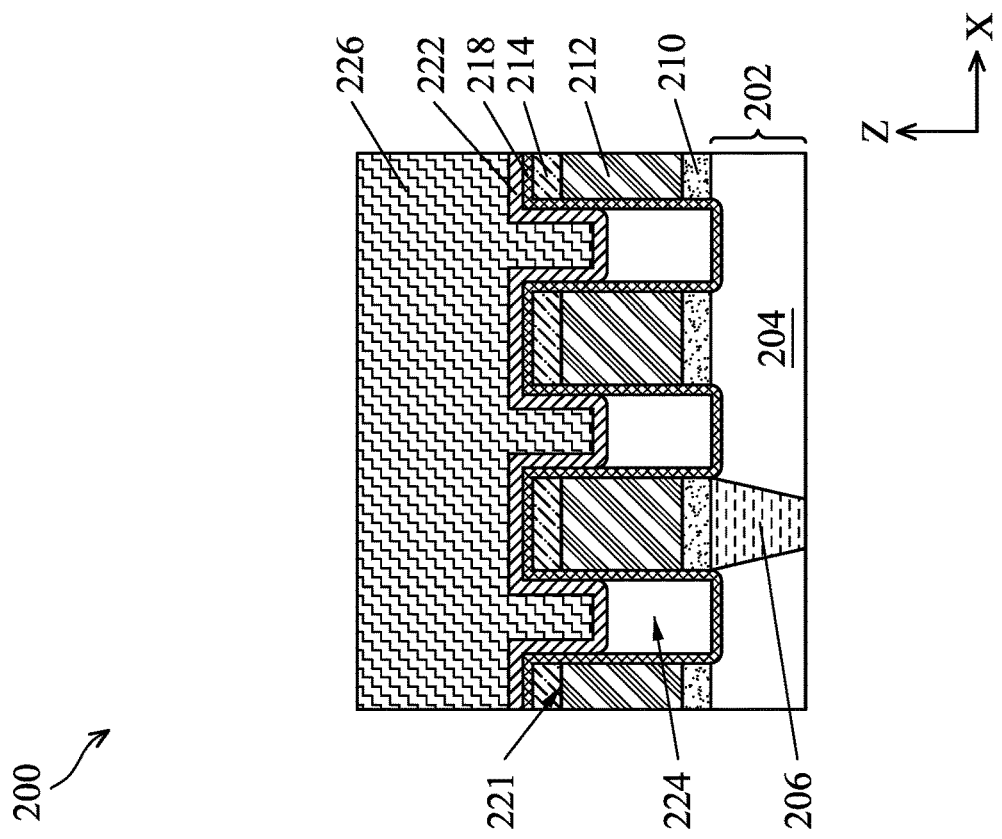
Figure 2I:
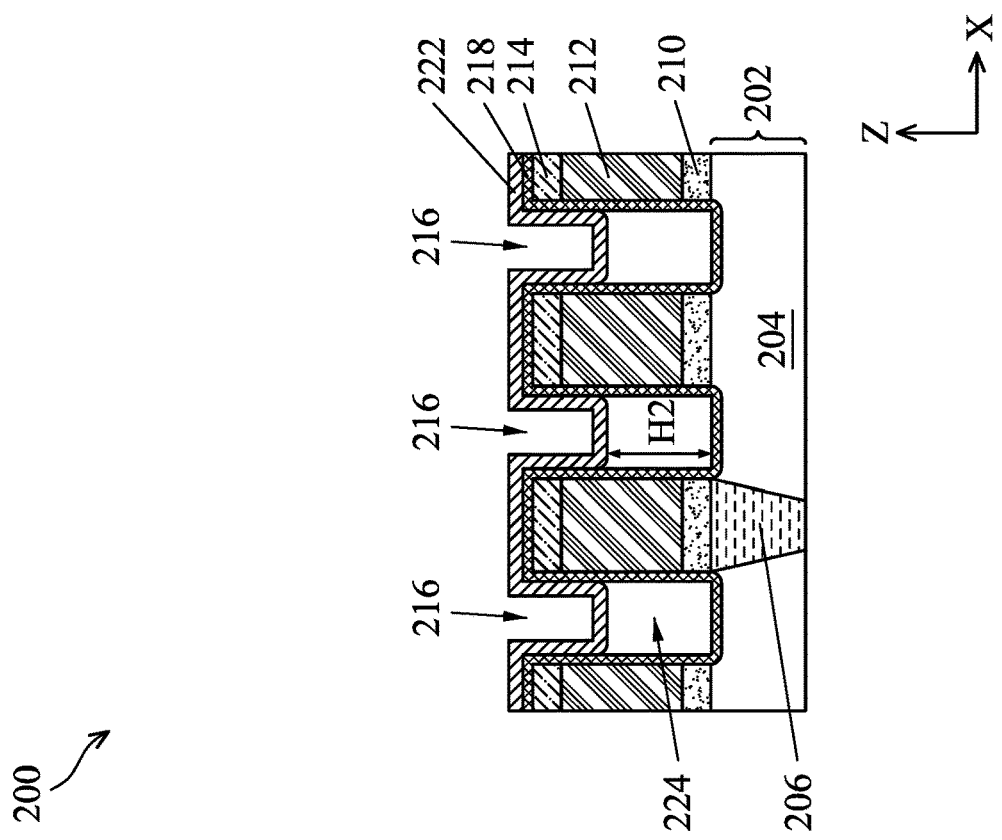
Figure 2J:
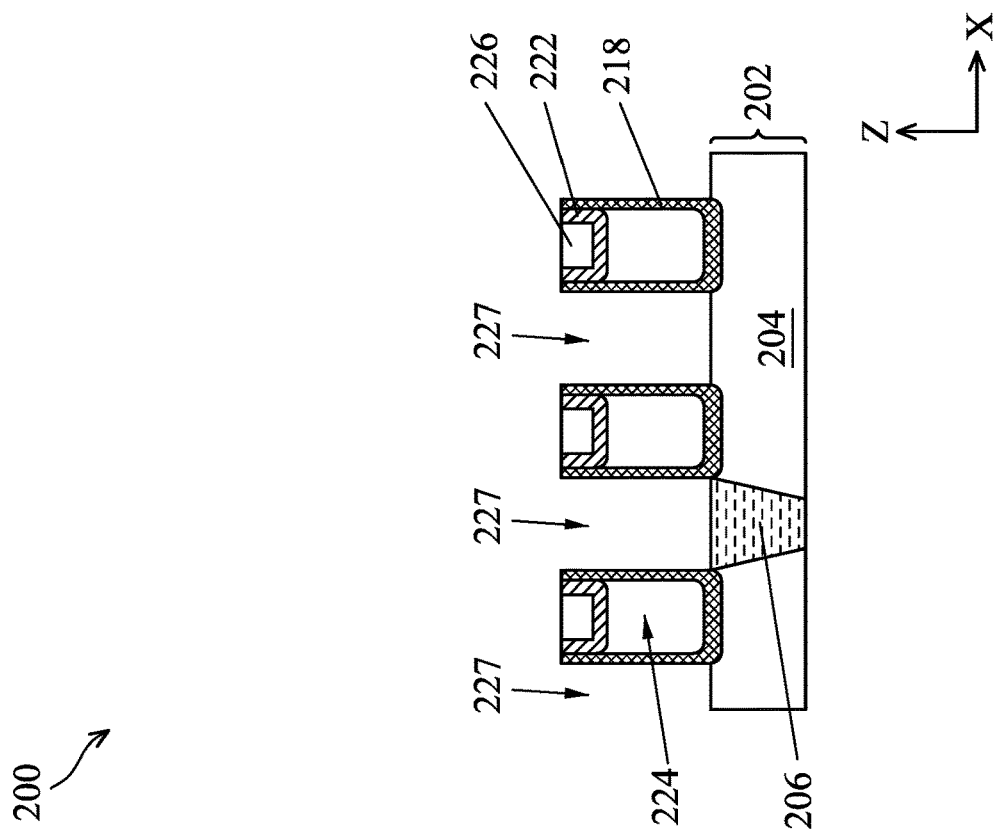
Figure 2K:
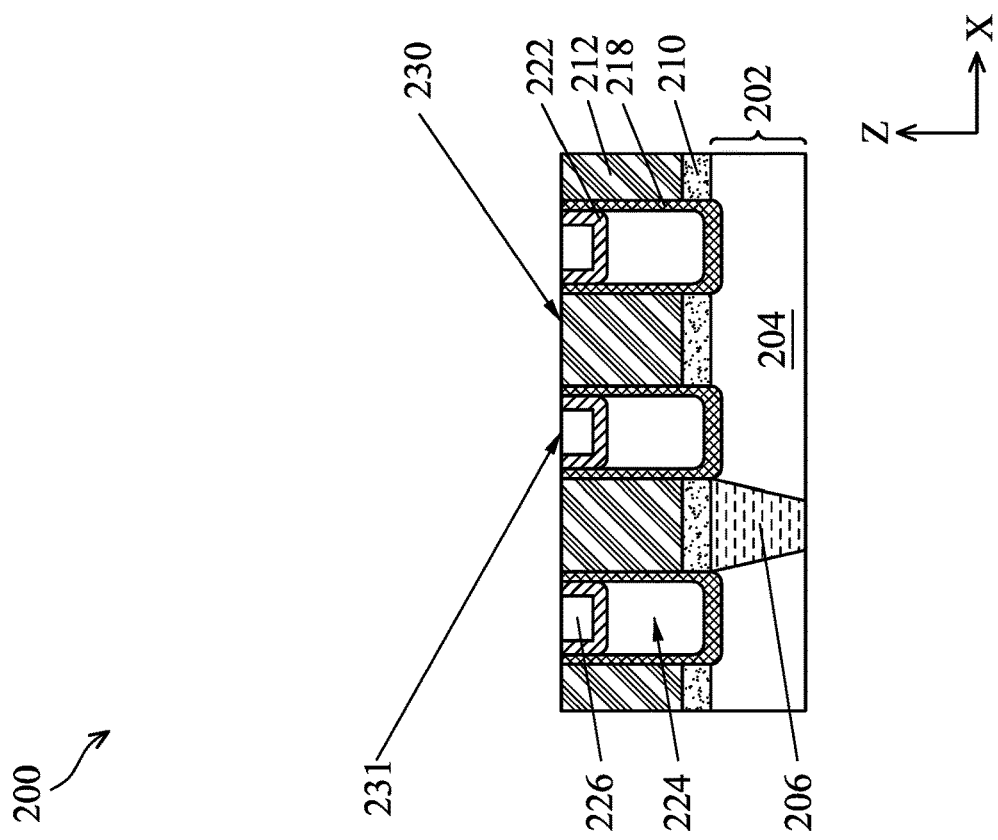
Figure 2M:
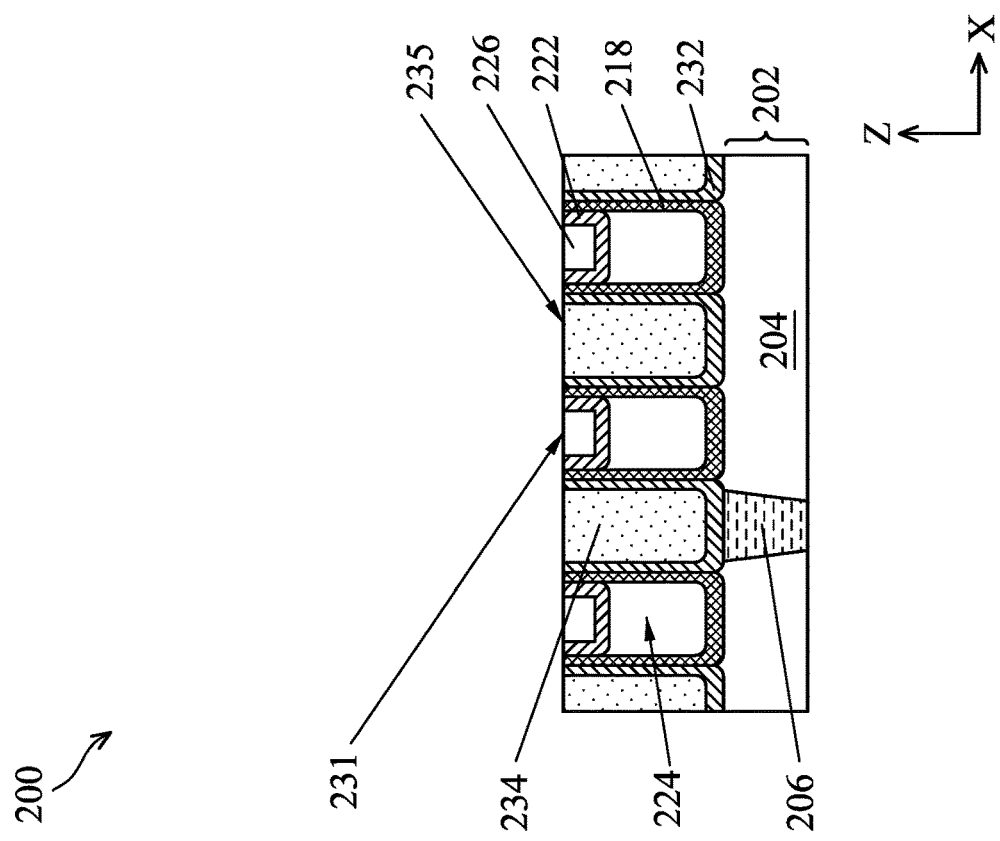
Figure 2L:
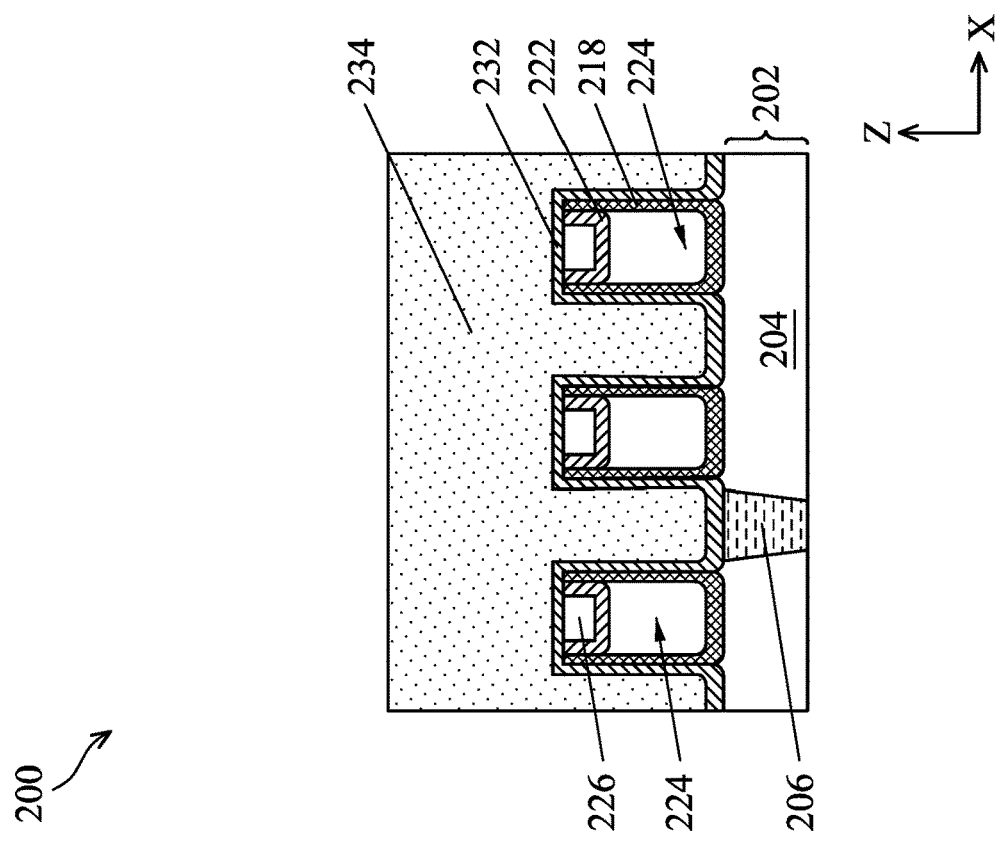
Figure 2N:
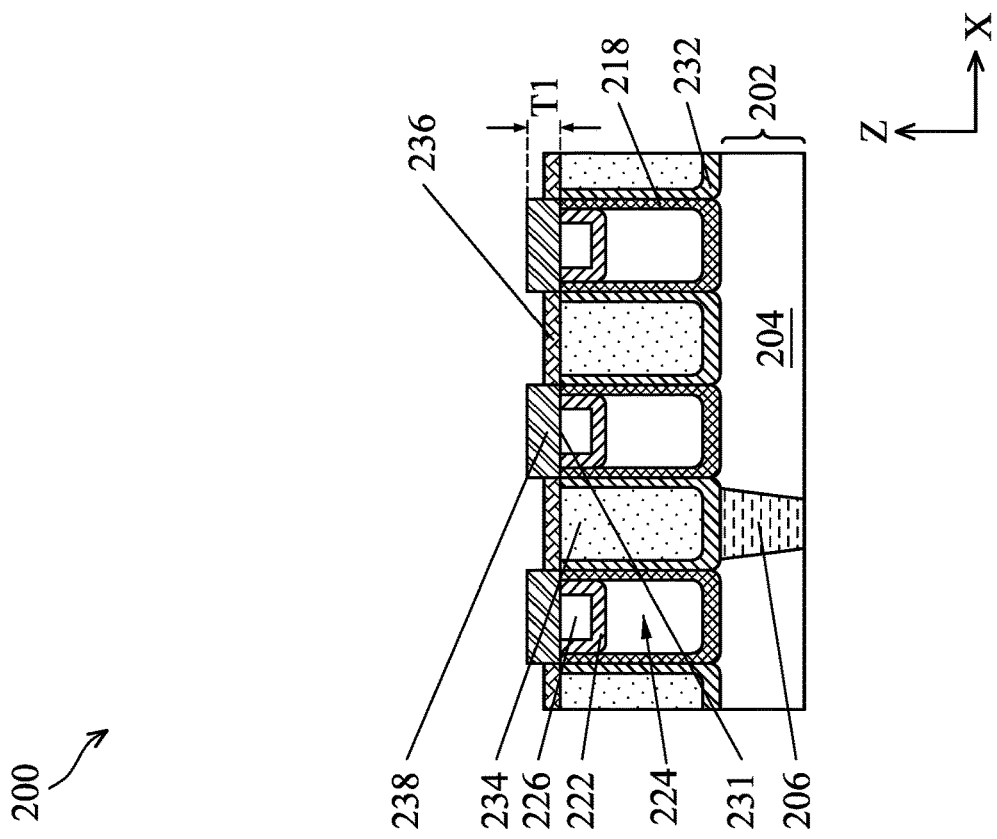
Figure 2O:
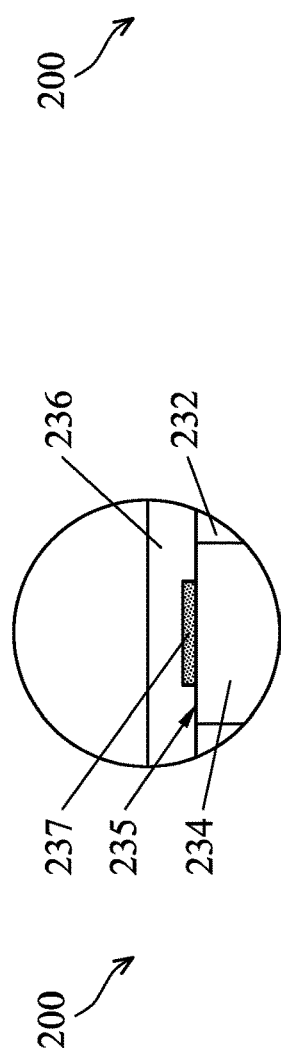
Figure 2P:
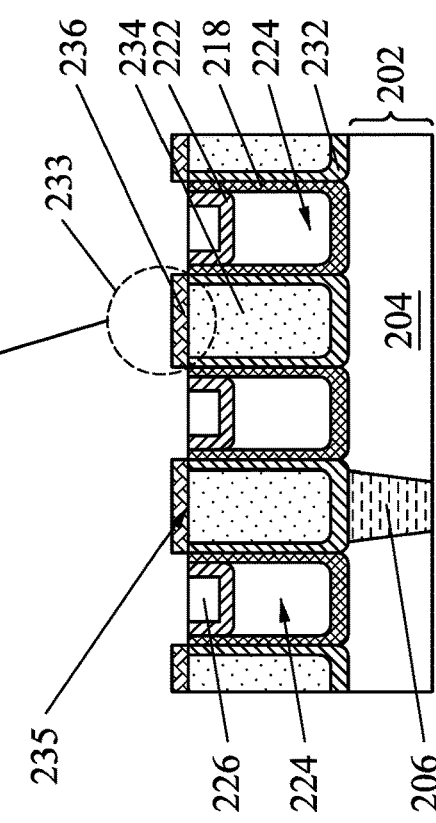
Figure 2R:
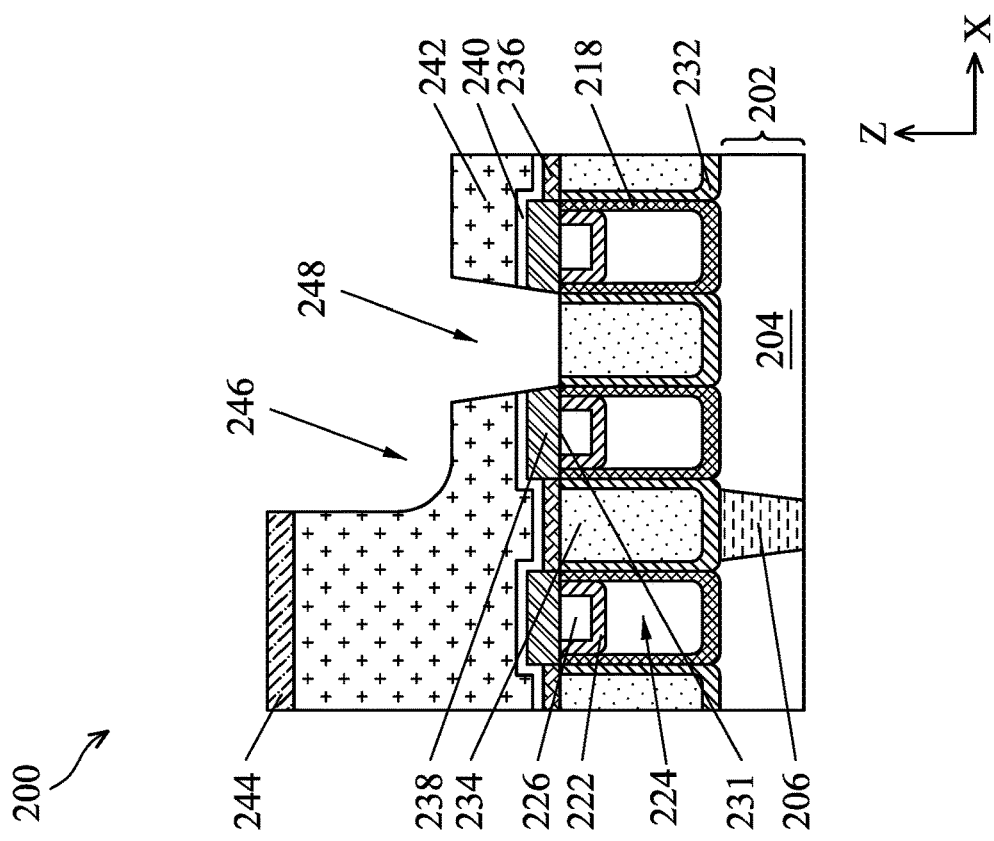
Figure 2Q:
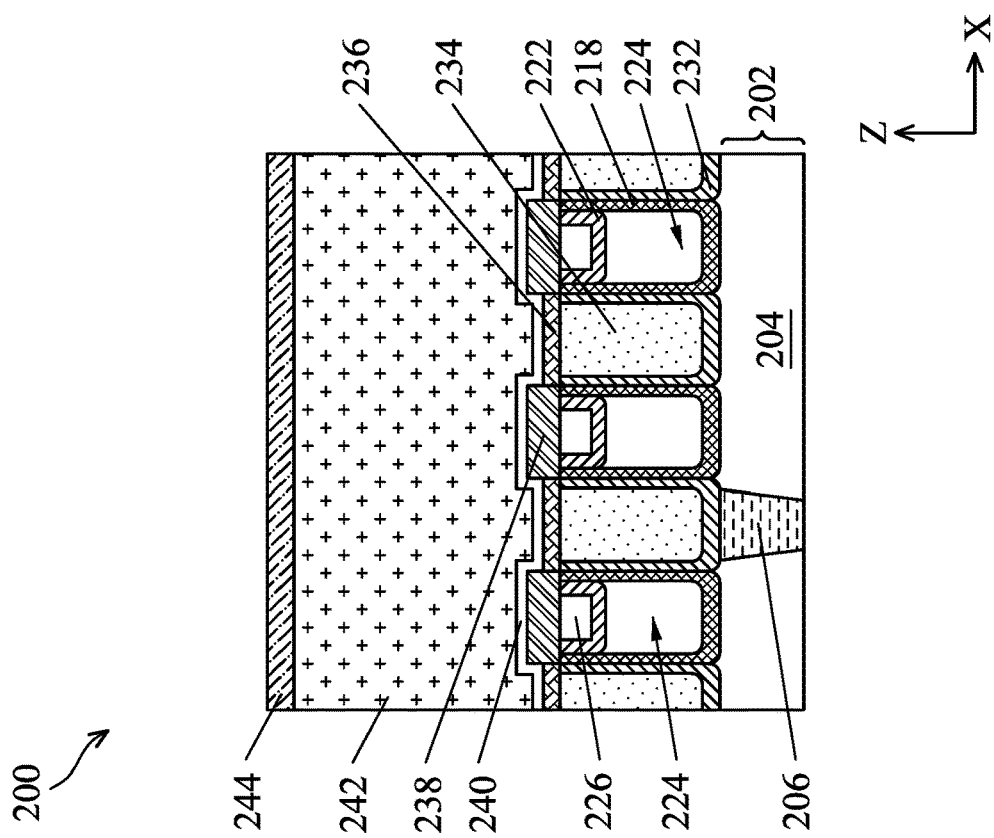
Figure 2T:
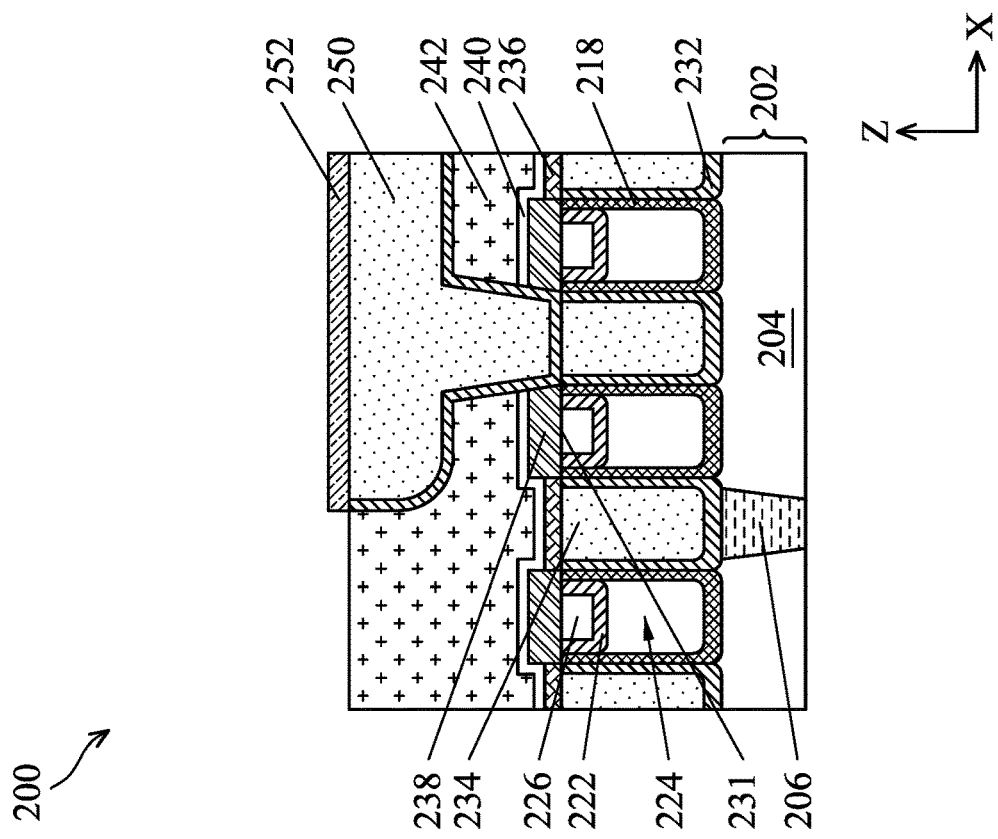

FIGS. 2A-2T are cross-sectional side views of various stages of manufacturing an interconnect structure 200, in accordance with some embodiments. As shown in FIG. 2A, the interconnect structure 200 includes a layer 202, which may be an ILD layer or an intermetal dielectric (IMD) layer. The interconnect structure 200 may be disposed over the device layer 180 shown in FIGS. 1A and 1B. For example, the layer 202 may be disposed over the ILD layer 120 (FIG. 1A). In some embodiments, the layer 202 may be disposed on the cap layer 122 (FIG. 1A). The layer 202 includes a dielectric layer 204 and one or more conductive features 206 (only one is shown) disposed in the dielectric layer 204. The dielectric layer 204 may include the same material as the insulating material 108. In some embodiments, the dielectric layer 204 includes silicon oxide. The dielectric layer 204 may be formed by chemical vapor deposition (CVD), atomic layer deposition (ALD), spin coating, or other suitable process. In some embodiments, an optional cap layer (not shown) may be disposed on each conductive feature 206. The conductive feature 206 and the optional cap layer may each include a metal. The conductive feature 206 and the cap layer (if used) may each include an electrically conductive material, such as Cu, Co, Ru, Mo, Cr, W, Mn, Rh, Ir, Ni, Pd, Pt, Ag, Au, Al, alloys thereof, or other suitable material. The conductive feature 206 and the cap layer (if used) may be formed by physical vapor deposition (PVD), CVD, ALD, or other suitable process. The conductive feature 206 may have a thickness ranging from about 50 Angstroms to about 500 Angstroms, and the cap layer (if used) may have a thickness ranging from about 2 Angstroms to about 50 Angstroms. The conductive features 206 may be electrically connected to corresponding conductive contacts 126 (FIG. 1A).

As shown in FIG. 2B, a glue layer 210, a conductive layer 212, and a hard mask 214 are formed over the layer 202. In some embodiment, the glue layer 210 is formed on the layer 202, the conductive layer 212 is formed on the glue layer 210, and the hard mask 214 is formed on the conductive layer 212. In some embodiments, the glue layer 210 is not present, and the conductive layer 212 is formed on the layer 202. The glue layer 210 may include a nitride, such as a metal nitride, and may be formed by PVD, CVD, ALD, or other suitable process. The glue layer 210 may be made of Ti or Ta. In some embodiments, the glue layer 210 includes TiN or TaN. The glue layer 210 may have a thickness ranging from about 2 Angstroms to about 100 Angstroms. The glue layer 210 may provide adhesion between the conductive layer 212 and the conductive feature 206 and the cap layer (if used). The conductive layer 212 may include a material having a different etch rate as compared to the glue layer 210. In some embodiments, the conductive layer 212 is a sacrificial layer to be replaced with a second conductive layer (e.g., a conductive layer 234 shown in FIG. 2M) at a later stage. In such cases, the conductive layer 212 may be any suitable conductive material such as a metal nitride (e.g., TiN). Alternatively, the conductive layer 212 may include the same material as the conductive feature 206 and may be formed by the same process as the conductive feature 206. The conductive layer 212 may have the same thickness as the conductive feature 206. The hard mask 214 may include SiN, SiON, SiO$_2$, the like, or a combination thereof, and may be formed by CVD, PVD, ALD, spin coating, or other suitable process.

As shown in FIG. 2C, after the glue layer 210, the conductive layer 212 and the hard mask 214 are formed, openings 216 are formed in the hard mask 214, the conductive layer 212, and the glue layer 210. Openings 216 may be formed by first patterning the hard mask 214, followed by transferring the pattern of the hard mask 214 to the conductive layer 212 and the glue layer 210. The openings 216 may be formed by any suitable process, such as wet etch, dry etch, or a combination thereof. In some embodiments, the openings 216 are formed by one or more etch processes. The openings 216 separate the conductive layer 212 into one or more portions, such as a plurality of portions.

As shown in FIG. 2D, a capping layer 218 is then formed on the exposed surfaces of the portions of the hard mask 214, the conductive layer 212, the glue layer 210, and the dielectric layer 204. The capping layer 218 may provide adhesion to at least the hard mask 214, the conductive layer 212, and the glue layer 210. The capping layer 218 may be made of a dielectric material. In some embodiments, the capping layer 218 includes SiO, SiCO, SiNO, SiCN, SiCON, AlN, AlON, AlO, or other suitable dielectric materials. The capping layer 218 may be formed by any suitable process, such as PVD, ALD, CVD, PECVD, or any suitable conformal process. The term "conformal" may be used herein for ease of description upon a layer having substantial same thickness over various regions. The capping layer 218 may have a thickness ranging from about 2 Angstroms to about 50 Angstroms.

As shown in FIG. 2E, after the formation of the capping layer 218, a sacrificial layer 220 is formed in the openings 216 (FIG. 2D) and on the capping layer 218. The sacrificial layer 220 may include a polymer, such as an organic layer having C, O, N, and/or H. In some embodiments, the sacrificial layer 220 is a degradable gap-fill material such as polyurea. The sacrificial layer 220 may be formed by any suitable process, such as CVD, ALD, molecular layer deposition (MLD), plasma enhanced CVD (PECVD), plasma enhanced ALD (PEALD), or spin-on.

As shown in FIG. 2F, the sacrificial layer 220 is recessed to a level below the level of a top surface 221 of the conductive layer 212. The recess of the sacrificial layer 220 may be performed by any suitable process, such as thermal baking, UV curing, an etch-back process (e.g., a plasma etch process), or any combination thereof. In some embodiments, the sacrificial layer 220 is recessed by a UV curing process that expose the sacrificial layer 220 to UV energy having an energy density ranging from about 10 mJ/cm$^2$ to about 100 J/cm$^2$. The recess of the sacrificial layer 220 may partially open the openings 216. In some embodiments, the recess of the sacrificial layer 220 may expose at least a portion of the capping layer 218 in the openings 216. The remaining sacrificial layer 220 may have a height H1 ranging from about 10 Angstroms to about 1000 Angstroms.

As shown in FIG. 2G, a support layer 222 is formed on the exposed surfaces of the interconnect structure 200. In some embodiments, the support layer 222 is formed on the sacrificial layer 220 and the capping layer 218. The support layer 222 may provide mechanical strength needed to sustain an air gap (e.g., air gap 224 in FIG. 2H) subsequently formed between the support layer 222 and the capping layer 218. The support layer 222 may include Si, O, N, or any combinations thereof. In some embodiments, the support layer 222 includes SiO, SiCO, SiNO, SiCN, or SiCON. The support layer 222 may be porous in order to allow UV energy, thermal energy, or plasma, etc., to reach the sacrificial layer 220 disposed therebelow. The support layer 222 may have a thickness ranging from about 2 Angstroms to about 100 Angstroms. The support layer 222 may be formed by any suitable process, such as PVD, CVD, ALD, PECVD, or PEALD. In some embodiments, the support layer 222 is a conformal layer formed by ALD or PEALD.

As shown in FIG. 2H, the sacrificial layer 220 is removed, forming an air gap 224 in each opening 216 between the support layer 222 and the capping layer 218. The removal of the sacrificial layer 220 may be a result of degradation or decomposition of the sacrificial layer 220. The decomposition or degradation of the sacrificial layer 220 may be performed by any suitable process, such as thermal baking and/or UV curing. In some embodiments, an UV curing process is performed to remove the sacrificial layer 220. The UV energy may pass through the porous support layer 222 to reach and remove the sacrificial layer 220. The UV energy may have an energy density ranging from about 10 mJ/cm$^2$ to about 100 J/cm$^2$. The removal of the sacrificial layer 220 does not substantially affect the other layers of the interconnect structure 200. The air gap 224 may have the height H2, which is the same as the height H1 of the sacrificial layer 220 shown in FIG. 2F. The air gap 224 may reduce capacitive coupling between neighboring portions of the conductive layer 212. If the height H2 is less than about 10 Angstroms, the air gap 224 may not reduce capacitive coupling between neighboring portions of the conductive layer 212. On the other hand, if the height H2 is greater than about 1000 Angstroms, the support layer 222 may not have enough contact on the capping layer 218 to prevent materials subsequently formed on the support layer 222 from collapsing into the air gap 224.

As shown in FIG. 2I, a dielectric fill 226 is formed on the support layer 222. The dielectric fill 226 may enhance isolation of the air gaps 224 and provide adhesion between the support layer 222 and the subsequently formed first etch stop layer 238. The dielectric fill 226 may be a silicon-containing material, such as SiCO, SiCN, SiN, SiCON, $SiO_x$, SiC, or SiON. In some embodiments, the dielectric fill 226 includes a low-k dielectric material having a k value ranging from about 2 to about 3.6, such as SiCOH. The low-k dielectric material may have a porosity ranging from about 0.1 percent to about 40 percent. The dielectric fill 226 may partially fill the openings 216 (FIG. 2H) and over the hard mask 214, as shown in FIG. 2I. The dielectric fill 226 may be formed by CVD, ALD, PECVD, PEALD, or other suitable process.

As shown in FIG. 2J, a planarization process may be performed to remove a portion of the dielectric fill 226 formed over the conductive layer 212. The hard mask 214 and portions of the capping layer 218 and the support layer 222 disposed over the hard mask 214 are also removed as a result of the planarization process. The planarization process may be any suitable process, such as a chemical-mechanical polishing (CMP) process. As a result of the planarization process, a top surface 230 of the conductive layer 212 may be substantially co-planar with a top surface 231 of the dielectric fill 226. The remaining dielectric fill 226 may have a thickness ranging from about 10 Angstroms to about 700 Angstroms. The support layer 222 and the dielectric fill 226 together prevent the materials introduced during the planarization process, for example the slurry, from entering the air gaps 224.

As shown in FIG. 2K, the conductive layer 212 and the glue layer 210 are removed. Openings 227 are formed in the regions between adjacent capping layers 218 where the conductive layer 212 and the glue layer 210 were removed. The removal of the conductive layer 212 and the glue layer 210 may be performed by any suitable removal process, such as dry etch, wet etch, or a combination thereof. The removal process may be selective etch processes that remove the conductive layer 212 but not the dielectric fill 226, the support layer 222, and the capping layer 218. Once the conductive layer 212 is removed, one or more selective etch processes, such as dry etch, wet etch, or a combination thereof, may be performed to selectively remove the glue layer 210 while leaving the dielectric fill 226, the support layer 222, and the capping layer 218 intact. Portions of the conductive feature 206 and the dielectric layer 204 are exposed through the openings 227 as a result of the removal processes.

As shown in FIG. 2L, a barrier layer 232 is formed on the exposed surfaces of the interconnect structure 200. The barrier layer 232 forms on the exposed surfaces of the dielectric layer 204, the conductive feature 206, the capping layer 218, and over the support layer 222 and the dielectric fill 226. The barrier layer 232 may include Co, W, Ru, Al, Mo, Ti, TiN, TiSi, CoSi, NiSi, Cu, TaN, Ni, or TiSiNi and may be formed by any suitable process, such as PVD, ALD, or PECVD. In some embodiments, the barrier layer 232 may be a conformal layer formed by a conformal process, such as ALD.

Next, a conductive layer 234 is formed on the barrier layer 232. The conductive layer 234 fills the openings 227 (FIG. 2K) and is formed above the dielectric fill 226. The conductive layer 234 may include an electrically conductive material, such as a metal. For example, the conductive layer 234 includes Cu, Co, Ru, Mo, Cr, W, Mn, Rh, Ir, Ni, Pd, Pt, Ag, Au, Al, alloys thereof, or other suitable material. The conductive layer 234 may include or be made of the same material as the conductive layer 212. The conductive layer 234 may be formed by any suitable process, such as electrochemical plating (ECP), PVD, CVD, or PECVD. The replacement of the conductive layer 212 with the conductive layer 234 ensures the conductive layer 234 is not subjected to any damages that may otherwise occurred during various processes (e.g., etching) as discussed above with respect to FIGS. 2C-2J. With this approach, the air gaps 224 can be formed without damaging the conductive layer 234 because the air gaps 224 are protected by the capping layer 218 and the support layer 222, and the conductive layer 234 is deposited after the air gaps 224 are formed.

As shown in FIG. 2M, a planarization process, such as a CMP process, is performed to remove portions of the conductive layer 234 and the barrier layer 232 disposed over dielectric fill 226. In some embodiments, the planarization process is performed until at least the top surface 231 of the dielectric fill 226 is exposed. The top surface 231 of the dielectric fill 226 is substantially co-planar with a top surface 235 of the conductive layer 234 upon the planarization process.

As shown in FIG. 2N, a graphene layer 236 is formed on the exposed top surfaces 235 of each conductive layer 234 and exposed surfaces of the barrier layer 232. The graphene layer 236 may serve as a diffusion barrier and/or cap layer which prevents the subsequently formed first etch stop layer 238 from forming on the conductive layers 234. The graphene layer 236 also prevents exposure of conductive layers 234 to oxidizing environments which can cause formation of non-conducting thin film (e.g., copper oxide) that may modify the character of the surface electron scattering and increase the overall resistivity of metallic interconnects. The term "graphene" used in this disclosure refers to a monoatomic thickness planar sheet of sp2-bonded carbon atoms arranged in a two-dimensional (2D) honeycomb crystal lattice. The graphene layer 236 may be formed on the conductive layer 234 and the barrier layer 232 using any suitable selective deposition process such as, for example, CVD, PECVD, ultraviolet (UV) assisted CVD, PVD, ALD, or PEALD.

In one embodiment where a CVD process is used, the graphene layer 236 is formed by exposing the exposed surfaces of the conductive layers 234 and the barrier layer 232 to a carbon-containing precursor and other precursor(s), such as hydrogen ($H_2$) and/or argon. The metallic surfaces of the conductive layers 234 and the barrier layer 232 promote selective growth of graphene layer 236 thereon, with little or no graphene layer 236 grown on the dielectric surfaces of the dielectric fill 226, the support layer 222, and the capping layer 218. Suitable carbon-containing precursors may include, but are not limited to, methane, ethane, ethylene, or any suitable hydrocarbon gas. The selective growth of the graphene layer 236 may be performed in a temperature range from about 200 degree Celsius to about 1200 degree Celsius, and a pressure range from about 0.25 Torr to about 30 atm.

The graphene layer 236 may include one atomic layer of graphene (e.g., monolayer graphene) or multiple atomic layers of graphene (e.g., multilayer graphene). The term "multiple atomic layers of graphene" used herein refers to a graphene layer having more than one atomic layer, such as 2 to 100 atomic layers of graphene. The deposited graphene material 236 may have a total thickness ranging from about 3 Angstroms to about 350 Angstroms, which may vary depending on the application.

In some embodiments, a graphene seed layer may be disposed on the exposed top surfaces 235 of each conductive layer 234. The graphene seed layer may serve as nucleation sites for carbon atoms to be introduced from the carbon-containing precursor during formation of the graphene layer 236. When forming the graphene layer 236, carbon atoms may crystallize around the graphene seed layer, leading to graphene growth from the graphene seed layer on the conductive layer 234 (and onto the barrier layer 232). The graphene seed layer may also be used to facilitate the bonding of the graphene layer 236 to the conductive layer 234 and the barrier layer 232. The graphene seed layer may consist of single, or optionally, several layers of high-quality graphene. The deposited graphene seed layer may have a total thickness ranging from about 3 Angstroms to about 100 Angstroms. FIG. 2O is an enlarged view of a portion 233 of the interconnect structure 200 showing a graphene seed layer 237 is formed on the exposed top surface 235 of the conductive layer 234, in accordance with some embodiments.

While graphene material is discussed in this disclosure, other carbon layer or carbon-based material layer, such as carbide-derived carbon, carbon nanotube, a composite or a mixture thereof, may also be used. If desired, the graphene layer 236 may be replaced with any suitable two-dimensional (2D) materials. The term "2D" used in this disclosure refers to single layer materials or monolayer-type materials that are atomically thin crystalline solids having intralayer covalent bonding and interlayer van der Waals bonding. Examples of a 2D material may include transition metal dichalcogenides, or $MX_2$, where M is a transition metal element and X is a chalcogenide element. Some exemplary $MX_2$ materials may include, but are not limited to $WS_2$, $MoS_2$, $WSe_2$, $MoSe_2$, or any combination thereof.

As shown in FIG. 2P, after the formation of the graphene layer 236, a first etch stop layer 238 is formed on the exposed top surfaces 231 of the dielectric fill 226 and the exposed surfaces of the support layer 222 and capping layer 218. The first etch stop layer 238 may be formed on the exposed dielectric surfaces of the dielectric fill 226, the support layer 222, and the capping layer 218 using any suitable process, such as a selective dielectric-on-dielectric (DoD) deposition process. The graphene layer 236 blocks the first etch stop layer 238 from forming on the metallic surfaces of the conductive layer 234 and the barrier layer 232. The first etch stop layer 238 may include a metal, such as Al, Ti, Zr, Hf, Y, or other suitable metal, and can be in the form of an oxide, nitride, carbide, a mixture or composite thereof. The first etch stop layer 238 may have a thickness T1 ranging from about 20 Angstroms to about 200 Angstroms. The first etch stop layer 238 provides a distinct etch selectivity from the subsequent second etch stop layer 240 (FIG. 2Q). The first etch stop layer 238 and the subsequent second etch stop layer 240 together prevent a subsequently formed conductive feature 250 (FIG. 2S) from entering between the neighboring portions of the conductive layer 234 as a result of an edge placement error (EPE). Thus, if the thickness T1 of the first etch stop layer 238 is less than about 20 Angstroms, the first etch stop layer 238 may not be sufficient to prevent the conductive feature 250 (FIG. 2S) from entering between the neighboring portions of the conductive layer 234. On the other hand, if the thickness T1 of the first etch stop layer 238 is greater than about 200 Angstroms, manufacturing cost is increased without significant advantage.

As shown in FIG. 2Q, a second etch stop layer 240 is formed on the exposed surfaces of the first etch stop layer 238 and the graphene layer 236. The second etch stop layer 240 may be a single layer or a multi-layer structure. The second etch stop layer 240 may include a material different from the first etch stop layer 238 in order to have different etch selectivity compared to the first etch stop layer 238. In such cases, the second etch stop layer 240 may include a silicon-containing material, such as SiCO, SiCN, SiN, SiCON, $SiO_x$, SiC, SiON, or the like, or an aluminum-containing material, such as AlNx, AlON, AlOx, or the like. Alternatively, the second etch stop layer 240 may include the same material as the first etch stop layer 238. The second etch stop layer 240 may be formed by PVD, CVD, ALD, spin-on, or any suitable deposition process. The second etch stop layer 240 may have a thickness ranging from about 2 Angstrom to about 200 Angstroms.

Next, a dielectric material 242 is formed on the second etch stop layer 240, and a hard mask 244 is formed on the dielectric material 242. The dielectric material 242 may include the same material as the dielectric fill 226 and may be formed by the same process as the dielectric fill 226. The second etch stop layer 240 and the dielectric material 242 may have different etch selectivity, and the first etch stop layer 238 and the dielectric material 242 may have different etch selectivity. The hard mask 244 may include the same material as the hard mask 214 and may be formed by the same process as the hard mask 214.

As shown in FIG. 2R, contact openings 246, 248 are formed in the hard mask 244 and the dielectric material 242. The contact openings 246, 248 may be formed by any suitable etch/patterning process, such as a dual-damascene process. For example, the contact opening 246 may be first formed by patterning the hard mask 244 and transferring the pattern to a portion of the dielectric material 242. An optional etch stop layer (not shown) may be embedded in the dielectric material 242 and utilized in forming the contact opening 246. The contact opening 248 is then formed by covering a portion of a bottom of the contact opening 246. Thus, the contact opening 248 has a smaller dimension than the contact opening 246. In some embodiments, the contact opening 248 is a via and the contact opening 246 is a trench.

In some embodiments, the etch processes remove a portion of the second etch stop layer 240 and the graphene layer 236, so that the contact opening 248 exposes at least the top surface 235 of a portion of the conductive layer 234, as shown in FIG. 2R. Portions of the second etch stop layer 240 and the graphene layer 236 may be removed by one or more etch processes, such as a wet etch, a dry etch, or a combination thereof. In some aspects, the second etch stop layer 240 may be first removed by a wet etch process or a dry etch process, and then the graphene layer 236 may be removed by a dry etch process. For example, a first plasma etch process can be used to remove portions of the second etch stop layer 240 disposed over the conductive layer 234 and a second plasma etch process can be used to remove the graphene layer 236 disposed on the conductive layer 234. The first plasma etch process may use plasma formed from a process gas containing an oxygen-containing gas, a halogen-containing gas, a noble gas, or other suitable process gas, or any combination thereof, and the second etch process may use plasma formed from a process gas containing a hydrogen-containing gas, a nitrogen-containing gas, an oxygen-containing gas, a fluorine-containing gas, or other suitable process gas, or any combination thereof. In some aspects, the second etch stop layer 240 and the graphene layer 236 can be removed by one or more anisotropic etch processes, such as plasma etching, reactive ion etching (RIE), or deep reactive ion etching (DRIE) process, etc. For example, a plasma etching process using an oxygen-containing gas (e.g., $CO_2$), a hydrogen-containing gas (e.g., $NH_3$), or other suitable process gas, may be used to remove the second etch stop layer 240 and the graphene layer 236.

In most embodiments, the contact opening 248 is aligned with a portion of the conductive layer 234, such as the portion of the conductive layer 234 disposed between two adjacent air gaps 224. In some embodiments, however, the contact opening 248 may be slightly misaligned with the portion of the conductive layer 234, and the first etch stop layer 238 is exposed. The misalignment of the via is known as an edge placement error (EPE). If the first etch stop layer 238 is not present, the contact opening 248 may be also formed in the dielectric fill 226, because the dielectric material 242 and the dielectric fill 226 may include the same material. As a result, subsequently formed conductive feature may be formed in the dielectric fill 226 between the neighboring portions of the conductive layer 234, which may cause line to line leakage. Reliability issues such as poor breakdown voltage or time dependent dielectric breakdown may occur as a result of the line to line leakage. With the first etch stop layer 238 disposed on the dielectric fill 226, the etch processes utilized to form the contact opening 248 do not substantially affect the first etch stop layer 238 due to the different etch selectivity compared to the dielectric material 242 and the second etch stop layer 240. Thus, with the first etch stop layer 238, the risk of line to line leakage is reduced when EPE occurs.

Figure 2S:
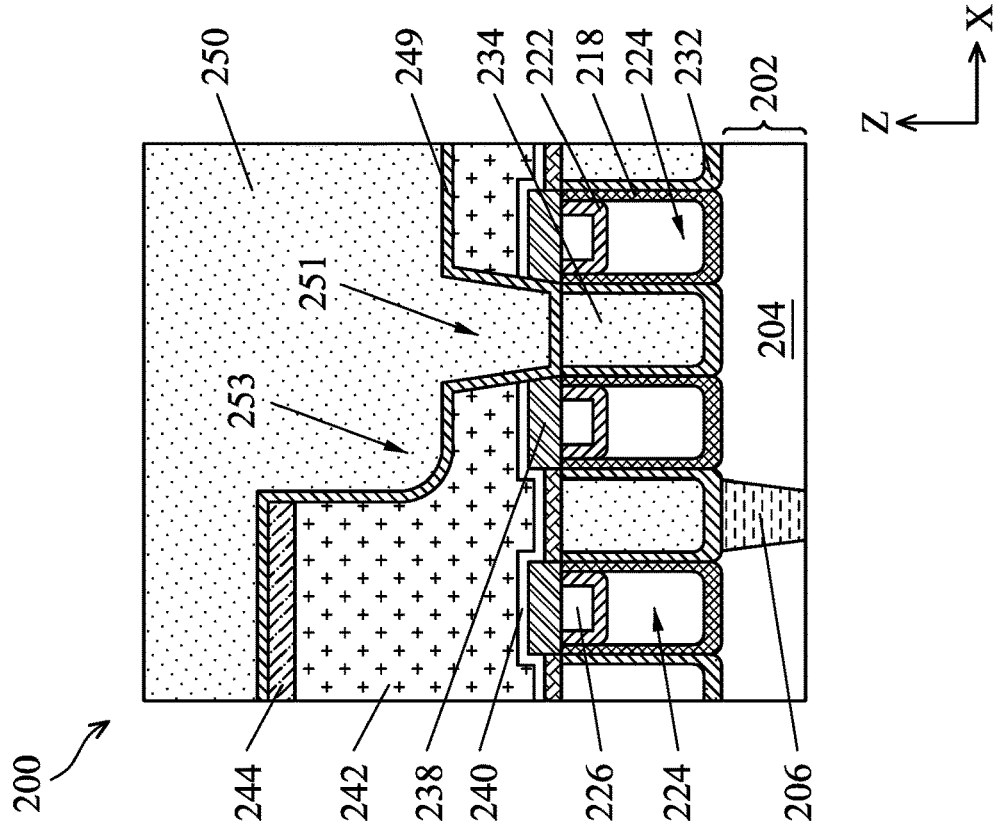

As shown in FIG. 2S, a barrier layer 249 and a conductive feature 250 are formed in the contact openings 246, 248. The barrier layer 249 may include Co, W, Ru, Al, Mo, Ti, TiN, TiSi, CoSi, NiSi, Cu, TaN, Ni, or TiSiNi and may be formed by any suitable process, such as PVD, ALD, or PECVD. In some embodiments, the barrier layer 249 may be a conformal layer formed by a conformal process, such as ALD, on or in contact with exposed surfaces of the hard mask 244, the dielectric material 242, the second etch stop layer 240, the first etch stop layer 238, the barrier layer 232, and the conductive layer 234. The conductive feature 250 may include an electrically conductive material, such as a metal. For example, the conductive feature 250 includes Cu, Ni, Co, Ru, Ir, Al, Pt, Pd, Au, Ag, Os, W, Mo, alloys thereof, or other suitable material. The conductive feature 250 may be formed on the barrier layer 249 by any suitable process, such as electro-chemical plating (ECP), PVD, CVD, or PECVD.

The conductive feature 250 may include a first portion 251 disposed in the contact opening 248 (FIG. 2R) and a second portion 253 disposed over the first portion 251. In some embodiments, the first portion 251 of the conductive feature 250 may be a conductive via, and the second portion 253 of the conductive feature 250 may be a conductive line. As described above, the first etch stop layer 238 prevents the conductive feature 250 from forming/entering between the neighboring portions of the conductive layer 234. The conductive feature 250 may be disposed adjacent and over the first etch stop layer 238. In some cases, a portion of the conductive feature 250, e.g., the first portion 251, may be disposed adjacent a vertical surface of the first etch stop layer 238, and a portion of the conductive feature 250, e.g., the second portion 253, may be disposed over a horizontal surface of the first etch stop layer 238, as shown in FIG. 2S.

As shown in FIG. 2T, a planarization process is performed to remove the portion of the barrier layer 249 and the conductive feature 250 disposed over the hard mask 244, and the hard mask 244 may be removed by the planarization process. The planarization process may be any suitable process, such as a CMP process. The top surfaces of the dielectric material 242, the barrier layer 249, and the conductive feature 250 are substantially co-planar upon completion of the planarization process.

Thereafter, a cap layer 252 may be selectively formed on the conductive feature 250 and the barrier layer 249. The conductive feature 250 may include the same material as the graphene layer 236 and may be formed by the same process as the graphene layer 236. The metallic surfaces of the conductive feature 250 and the barrier layer 249 promote the selective growth of the cap layer 252 on the conductive feature 250 and the barrier layer 249, but not on the dielectric material 242. Alternatively, the cap layer 252 may include an electrically conductive material, such as Cu, Co, Ru, Mo, Cr, W, Mn, Rh, Ir, Ni, Pd, Pt, Ag, Au, Al, alloys thereof, or other suitable material. In some embodiments, the cap layer 252 includes a metal. The cap layer 252 may be formed by PVD, CVD, ALD, or other suitable process. The cap layer 252 may have a thickness ranging from about 3 Angstroms to about 50 Angstroms.

An ILD layer or an intermetal dielectric (IMD) layer, such as the layer 202, may be formed on the cap layer 252 and the dielectric material 242, and the processes discussed above with respect to FIGS. 2A-2T may be repeated until a desired number of back-end-of-line (BEOL) interconnect structures is achieved.

Figure 3:
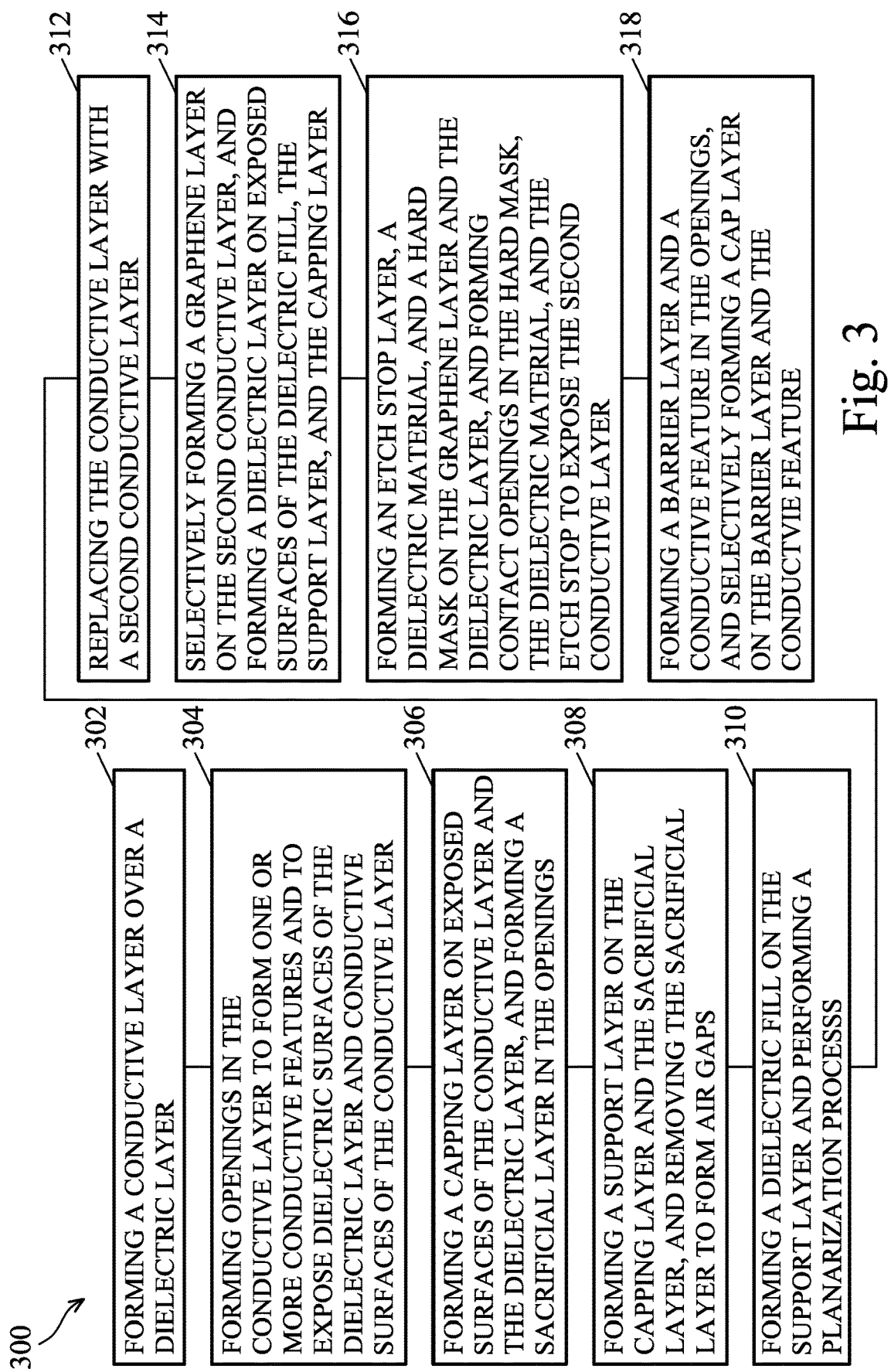
FIG. 3 is a flow chart showing a method of forming the interconnect structure, in accordance with some embodiments.

FIG. 3 is a flow chart showing a method 300 of forming the interconnect structure 200, in accordance with some embodiments. It is noted that the operations of the method 300, including any descriptions given with reference to the figures, are merely exemplary and are not intended to be limiting beyond what is specifically recited in the claims that follow. Additional operations may be implemented before, during, and after the method 300, and some operations may be replaced, eliminated, or rearranged in any desired order in accordance with various embodiments of the method 300.

The method 300 starts at operation 302 by forming a conductive layer over a layer. The conductive layer may be the conductive layer 212 (FIG. 2B), and the layer may be the layer 202 (FIG. 2A). The layer 202 may be a dielectric layer (such as the dielectric layer 204) having one or more conductive features (such as the conductive features 206) formed therein. The conductive layer and the layer may be formed by the processes discussed above with respect to FIGS. 2A and 2B.

At operation 304, one or more openings are formed in the conductive layer to form one or more conductive features and to expose dielectric surfaces of the dielectric layer and conductive surfaces of the conductive features. The one or more openings may be the one or more openings 216 (FIG. 2C), and the conductive features may be the portions of the conductive layer 212 (FIG. 2C). The dielectric surfaces of the layer may be the dielectric surfaces of the dielectric layer 204, and the conductive surfaces may be the conductive surfaces of the conductive layer 212. The openings and the conductive features may be formed by the processes discussed above with respect to FIG. 2C.

At operation 306, a capping layer is formed on exposed surfaces of the portions of the conductive layer and the dielectric layer, and a sacrificial layer is formed in the openings. The capping layer may be the capping layer 218 (FIG. 2E) and the sacrificial layer may be the sacrificial layer

220 (FIG. 2E). The sacrificial layer is recessed to have a height (such as the height H1 shown in FIG. 2F) in the openings. The capping layer and the sacrificial layer may be formed by the processes discussed above with respect to FIGS. 2E and 2F.

At operation 308, a support layer is formed on the exposed surfaces of the sacrificial layer in the openings and on the capping layer, and the sacrificial layer is removed to form air gaps. The support layer may be the support layer 222 (FIG. 2G), and the air gaps may be the air gaps 224 (FIG. 2H). The support layer and the air gaps may be formed by the processes discussed above with respect to FIGS. 2G and 2H.

At operation 310, a dielectric material is formed on the support layer and a planarization process is performed so that the top surfaces of the dielectric material and the conductive layer are co-planar. The dielectric material may be the dielectric fill 226 (FIG. 2J). The dielectric material may be formed by the processes discussed above with respect to FIGS. 2I and 2J.

At operation 312, the conductive layer is removed and replaced with a second conductive layer. The second conductive layer may be the conductive layer 234 (FIG. 2M) and formed by the processes discussed above with respect to FIGS. 2K to 2M.

At operation 314, one or more graphene layers are selectively formed on the exposed surfaces of the second conductive layers, and a dielectric layer is formed on the exposed surfaces of the dielectric material, the support layer, and the capping layer 218 not covered by the one or more graphene layers. The graphene layer prevents exposure of the second conductive layers to oxidizing environments which can cause formation of non-conducting thin film that may modify the character of the surface electron scattering and increase the overall resistivity of metallic interconnects. The dielectric layer prevents a subsequently formed conductive feature from entering between the neighboring portions of the second conductive layer as a result of an edge placement error (EPE). The one or more graphene layers may be the one or more graphene layers 236 (FIG. 2P), and the dielectric layer may be the first etch stop layer 238 (FIG. 2P). The graphene layers and the dielectric layer may be formed by the processes discussed above with respect to FIGS. 2N and 2P.

At operation 316, an etch stop layer, a dielectric material, and a hard mask are sequentially formed on the one or more graphene layers and the dielectric layer. Openings are then formed in the hard mask, the dielectric material, the etch stop layer, and the one or more graphene layers to expose at least the second conductive layer. The etch stop layer may be the second etch stop layer 240 (FIG. 2Q), the dielectric material may be the dielectric material 242 (FIG. 2Q), and the hard mask may be the hard mask 244 (FIG. 2Q). The openings are the contact openings 246, 248 (FIG. 2R). The etch stop layer, the dielectric material, the hard mask, and the openings may be formed by the processes discussed above with respect to FIGS. 2Q and 2R.

At operation 318, a barrier layer and a conductive feature are formed in the openings, and a cap layer is selectively formed on the barrier layer and the conductive feature. The barrier layer may be the barrier layer 249 (FIG. 2T), the conductive feature may be the conductive feature 250 (FIG. 2T), and the cap layer may be the cap layer 252 (FIG. 2T). The barrier layer, the conductive feature, and the cap layer may be formed by the processes discussed above with respect to FIGS. 2S and 2T.

Various embodiments of the present disclosure provide a graphene layer 236 covering portions of a conductive layer 234 formed in an interconnect structure 200. The graphene layer 236 serves as a diffusion barrier and/or cap layer which prevents a subsequently formed first etch stop layer 238 from forming on the conductive layers 234. The graphene layer 236 also prevents exposure of the conductive layers 234 to oxidizing environments which can cause formation of non-conducting thin film (e.g., copper oxide) that may modify the character of the surface electron scattering and increase the overall resistivity of metallic interconnects. Embodiments of the present disclosure also provide an improved process of forming air gaps 224 between neighboring portions of the conductive layers 234 without damaging the conductive layers 234 because the conductive layer 234 is deposited after the air gaps 224 are formed. The air gaps 224 can reduce capacitive coupling between the neighboring portions of the conductive layer 234, and the first etch stop layer 238 formed over the air gaps 224 can prevent a conductive feature 250 from forming between the neighboring portions of the conductive layer 234, which may otherwise result in reduced line to line leakage when EPE occurs.

An embodiment is a method for forming an interconnect structure. The method includes forming a first conductive layer over a dielectric layer, forming one or more openings in the first conductive layer to expose portions of dielectric surface of the dielectric layer and conductive surfaces of the first conductive layer, wherein the one or more openings separates the first conductive layer into one or more portions, forming a capping layer on exposed portions of the dielectric surface of the dielectric layer and conductive surface of the first conductive layer, forming a sacrificial layer in the one or more openings, recessing the sacrificial layer, forming a support layer on the recessed sacrificial layer in each of the one or more openings, removing the sacrificial layer to form an air gap in each of the one or more openings, forming a dielectric fill on the support layer, replacing the first conductive layer in the one or more openings with a second conductive layer, selectively forming a two-dimensional (2D) material layer on the second conductive layer, forming a first etch stop layer on the dielectric fill and the support layer, forming a second etch stop layer on the first etch stop layer and the 2D material layer, forming a dielectric material on the second etch stop layer, forming a contact opening through the dielectric material, the second etch stop layer, and the 2D material layer to expose a top surface of the second conductive layer, and forming a conductive feature in the contact opening.

Another embodiment is forming a first conductive feature in a dielectric layer, forming a first conductive layer over the dielectric layer, forming one or more openings in the first conductive layer to expose portions of the dielectric layer, forming a capping layer on exposed surfaces of the first conductive layer and the dielectric layer, filling a portion of the one or more openings with a sacrificial layer, forming a support layer on the capping layer and the sacrificial layer, removing the sacrificial layer to form an air gap in each of the one or more openings, forming a dielectric fill on the support layer in the one or more openings, removing the first conductive layer to expose at least the first conductive feature in the dielectric layer, forming a second conductive layer over the first conductive feature and in the one or more openings, selectively forming a two-dimensional (2D) material layer on the second conductive layer, forming a first etch stop layer on the dielectric fill and the support layer, and forming a dielectric material over the first etch stop layer.

A further embodiment is a method for forming an interconnect structure. The method includes forming a first conductive feature in a dielectric layer, forming a first conductive layer over the dielectric layer, forming one or more openings in the first conductive layer to expose portions of the dielectric layer, forming a capping layer on exposed surfaces of the one or more openings and the dielectric layer, forming a sacrificial layer on the capping layer in the one or more openings, forming a support layer on the sacrificial layer and the capping layer in the one or more openings, removing the sacrificial layer to form an air gap in the one or more openings, forming a dielectric fill on the support layer, replacing the first conductive layer with a second conductive layer, performing a planarization process so that surfaces of the second conductive layer are substantially co-planar with top surfaces of the dielectric fill, the support layer, the capping layer, and the dielectric fill, and selectively forming a two-dimensional (2D) material layer on the second conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming an interconnect structure, comprising:
   forming a first conductive layer over a dielectric layer;
   forming one or more openings in the first conductive layer to expose portions of a dielectric surface of the dielectric layer and conductive surfaces of the first conductive layer;
   forming a capping layer on exposed portions of the dielectric surface of the dielectric layer and the conductive surface of the first conductive layer;
   forming a sacrificial layer in the one or more openings;
   recessing the sacrificial layer;
   forming a support layer on the recessed sacrificial layer in each of the one or more openings;
   removing the sacrificial layer to form an air gap in each of the one or more openings;
   forming a dielectric fill on the support layer;
   replacing the first conductive layer in a region adjacent the one or more openings with a second conductive layer;
   selectively forming a two-dimensional (2D) material layer on the second conductive layer;
   forming a first etch stop layer on the dielectric fill and the support layer;
   forming a second etch stop layer on the first etch stop layer and the 2D material layer;
   forming a dielectric material on the second etch stop layer;
   forming a contact opening through the dielectric material, the second etch stop layer, and the 2D material layer to expose a top surface of the second conductive layer; and
   forming a first conductive feature in the contact opening.

2. The method of claim 1, wherein replacing the first conductive layer in the region adjacent the one or more openings with a second conductive layer comprises:
   removing the first conductive layer in the region adjacent the one or more openings;
   forming a second conductive layer in the region adjacent the one or more openings; and
   performing a planarization process so that surfaces of the second conductive layer are substantially co-planar with a top surface of the dielectric fill.

3. The method of claim 2, further comprising:
   prior to forming the second conductive layer in the region adjacent the one or more openings, forming a barrier layer on exposed surfaces of the region adjacent the one or more openings.

4. The method of claim 3, wherein the barrier layer is deposited such that the barrier layer is in contact with a portion of the capping layer, the support layer, and the dielectric fill.

5. The method of claim 4, wherein the barrier layer is further in contact with a second conductive feature disposed in the dielectric layer.

6. The method of claim 3, wherein the 2D material layer is deposited to further cover a top surface of the barrier layer.

7. The method of claim 1, wherein selectively forming a 2D material layer further comprises:
   forming a seed layer on the second conductive layer.

8. The method of claim 7, wherein the seed layer comprises graphene.

9. A method for forming an interconnect structure, comprising:
   forming a first conductive feature in a dielectric layer;
   forming a first conductive layer over the dielectric layer;
   forming one or more openings in the first conductive layer to expose portions of the dielectric layer;
   forming a capping layer on exposed surfaces of the first conductive layer and the dielectric layer;
   filling a portion of the one or more openings with a sacrificial layer;
   forming a support layer on the capping layer and the sacrificial layer;
   removing the sacrificial layer to form an air gap in each of the one or more openings;
   forming a dielectric fill on the support layer in the one or more openings;
   removing the first conductive layer to expose at least the first conductive feature in the dielectric layer;
   forming a second conductive layer over the first conductive feature and in the region adjacent the one or more openings;
   selectively forming a two-dimensional (2D) material layer on the second conductive layer;
   forming a first etch stop layer on the dielectric fill and the support layer; and
   forming a dielectric material over the first etch stop layer.

10. The method of claim 9, further comprising:
    prior to forming a second conductive layer, forming a first barrier layer on exposed surfaces of the region adjacent the one or more openings.

11. The method of claim 10, wherein the first barrier layer is deposited such that the barrier is in contact with a portion of the capping layer, the support layer, and the dielectric fill.

12. The method of claim 11, wherein the first barrier layer is further in contact with the first conductive feature in the dielectric layer.

13. The method of claim 9, further comprising:
forming a contact opening through the dielectric material and the 2D material layer to expose a top surface of the second conductive layer; and
forming a second conductive feature in the contact opening.

14. The method of claim 13, further comprising:
prior to forming the second conductive feature, forming a second barrier layer on exposed surfaces of the dielectric material, the second conductive layer, and the first barrier layer.

15. The method of claim 9, wherein selectively forming a 2D material layer further comprises:
forming a seed layer on the second conductive layer.

16. The method of claim 15, wherein the seed layer comprises graphene.

17. The method of claim 9, wherein selectively forming a 2D material layer further comprises:
exposing exposed surfaces of the second conductive layer and the first barrier layer to a carbon-containing precursor.

18. A method for forming an interconnect structure, comprising:
forming a first conductive feature in a dielectric layer;
forming a first conductive layer over the dielectric layer;
forming one or more openings in the first conductive layer to expose portions of the dielectric layer;
forming a capping layer on exposed surfaces of the first conductive layer and the dielectric layer;
forming a sacrificial layer on the capping layer in the one or more openings;
forming a support layer on the sacrificial layer and the capping layer in the one or more openings;
removing the sacrificial layer to form an air gap in the one or more openings;
forming a dielectric fill on the support layer;
replacing the first conductive layer with a second conductive layer;
performing a planarization process so that surfaces of the second conductive layer are substantially co-planar with top surfaces of the dielectric fill, the support layer, the capping layer, and the dielectric fill; and
selectively forming a two-dimensional (2D) material layer on the second conductive layer.

19. The method of claim 18, further comprising:
prior to forming the second conductive layer, forming a barrier layer on exposed surfaces of the capping layer, the dielectric layer, and the first conductive feature, wherein a top surface of the barrier layer is co-planar with the top surfaces of the dielectric fill, the support layer, the capping layer, and the dielectric fill after the planarization process.

20. The method of claim 19, wherein the 2D material layer is formed to be further in contact with the top surface of the barrier layer.

\* \* \* \* \*